United States Patent
Ordentlich et al.

(10) Patent No.: US 9,405,614 B2
(45) Date of Patent: Aug. 2, 2016

(54) METHOD AND SYSTEM FOR REDUCING WRITE-BUFFER CAPACITIES WITHIN MEMRISTOR-BASED DATA-STORAGE DEVICES

(75) Inventors: Erik Ordentlich, San Jose, CA (US); Gadiel Seroussi, Cupertino, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 201 days.

(21) Appl. No.: 14/233,230

(22) PCT Filed: Jul. 27, 2011

(86) PCT No.: PCT/US2011/045529
§ 371 (c)(1),
(2), (4) Date: Jan. 16, 2014

(87) PCT Pub. No.: WO2013/015803
PCT Pub. Date: Jan. 31, 2013

(65) Prior Publication Data
US 2014/0149824 A1    May 29, 2014

(51) Int. Cl.
*G11C 29/00* (2006.01)
*G06F 11/10* (2006.01)
*G11C 7/10* (2006.01)
(Continued)

(52) U.S. Cl.
CPC ............ *G06F 11/10* (2013.01); *G06F 11/1048* (2013.01); *G11C 7/1006* (2013.01); *G11C 7/1078* (2013.01); *G11C 13/0007* (2013.01); *G11C 13/0061* (2013.01);
(Continued)

(58) Field of Classification Search
CPC ..... G06F 11/10; G06F 11/1048; G06F 11/28; G06F 11/0703; G11C 13/0069; G11C 16/3468
See application file for complete search history.

(56) References Cited

U.S. PATENT DOCUMENTS

| 7,903,448 B2 | 3/2011 | Oh et al. |
| 2002/0181311 A1 | 12/2002 | Miyauchi |

(Continued)

FOREIGN PATENT DOCUMENTS

| CN | 1881455 | 12/2006 |
| CN | 101512661 | 8/2009 |

(Continued)

OTHER PUBLICATIONS

Burr et al., Phase change memory technology, Mar. 29, 2010, Journal of Vacuum Science and TEchnology B, vol. 28, Issue 2, pp. 223-262 (retrieved from Google.com Nov. 10, 2015).*

(Continued)

*Primary Examiner* — Shelly A Chase
(74) *Attorney, Agent, or Firm* — Olympic Patent Works PLLC

(57) ABSTRACT

One example disclosed in the application is an electronic data-storage device comprising one or more arrays of memory elements. The data-storage device also includes an error-control-coding encoder that encodes received data and a READ/WRITE controller that writes encoded data received from the error-control-coding encoder to a number of memory elements by applying the switching-inducing force or gradient to the one or more arrays of memory elements until more than a maximum-allowed number of WRITE requests have been queued to the WRITE-request buffer, until feedback signals indicate that the WRITE operation has completed, or until the switching-inducing force or gradient has been applied for a maximum application time.

15 Claims, 20 Drawing Sheets

(51) Int. Cl.
*G11C 13/00* (2006.01)
*G11C 16/34* (2006.01)

(52) U.S. Cl.
CPC ....... *G11C 13/0064* (2013.01); *G11C 13/0069* (2013.01); *G11C 16/3468* (2013.01); *G11C 2211/5624* (2013.01)

(56) References Cited

U.S. PATENT DOCUMENTS

| | | |
|---|---|---|
| 2006/0044878 A1 | 3/2006 | Perner |
| 2009/0109738 A1 | 4/2009 | Donze et al. |
| 2010/0162068 A1 | 6/2010 | Toda |
| 2010/0235714 A1 | 9/2010 | Toda |
| 2011/0026303 A1 | 2/2011 | Choi et al. |
| 2011/0069529 A1 | 3/2011 | Srinivasan et al. |

FOREIGN PATENT DOCUMENTS

| | | |
|---|---|---|
| CN | 101916211 | 12/2010 |
| CN | 102073603 | 5/2011 |
| KR | 1020080040248 A | 7/2008 |

OTHER PUBLICATIONS

PCT Search Report/Written Opinion~Application No. PCT/US2011/045529 dated Feb. 9, 2012~8 pages.

EP Search Report~Application No. 11869906.5-1805/2737482 dated Apr. 7, 2015~10 pages.

Wei Yi et al, Feedback write scheme for memristive switching devices, Applied physics A, Jan. 27, 2011, pp. 973-982, Information and Quantum Systems Lab, HP Laboratories, USA.

* cited by examiner

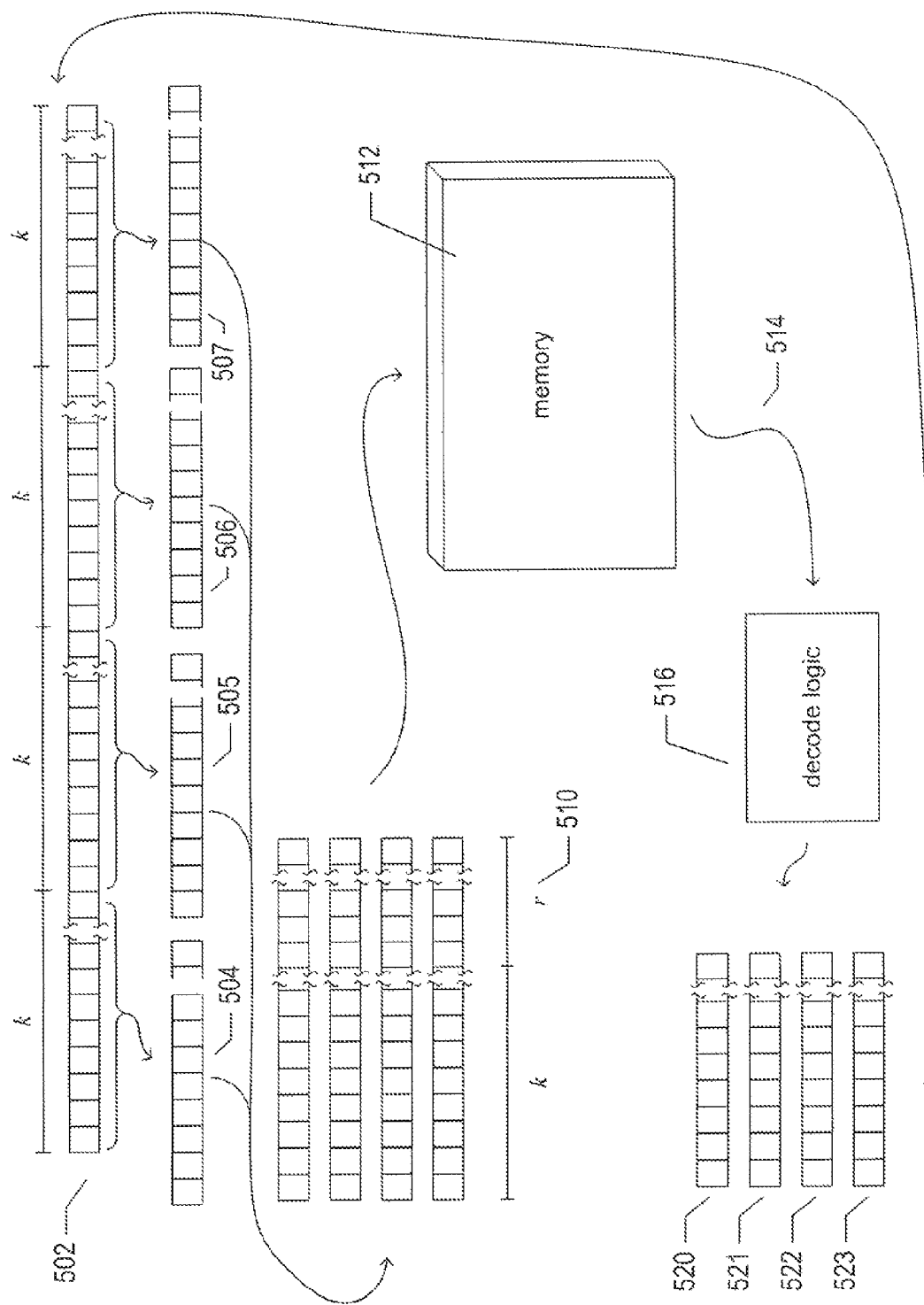

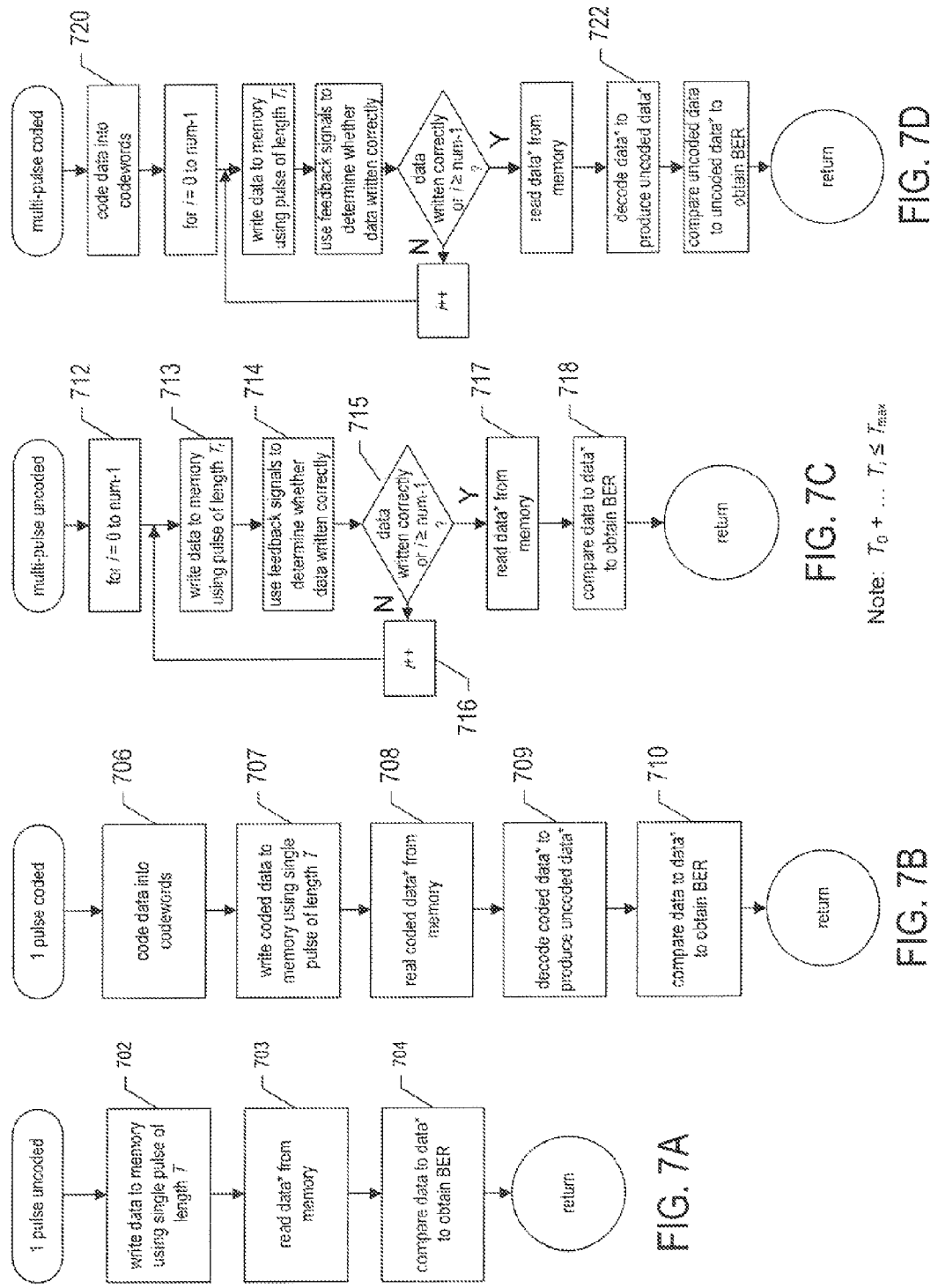

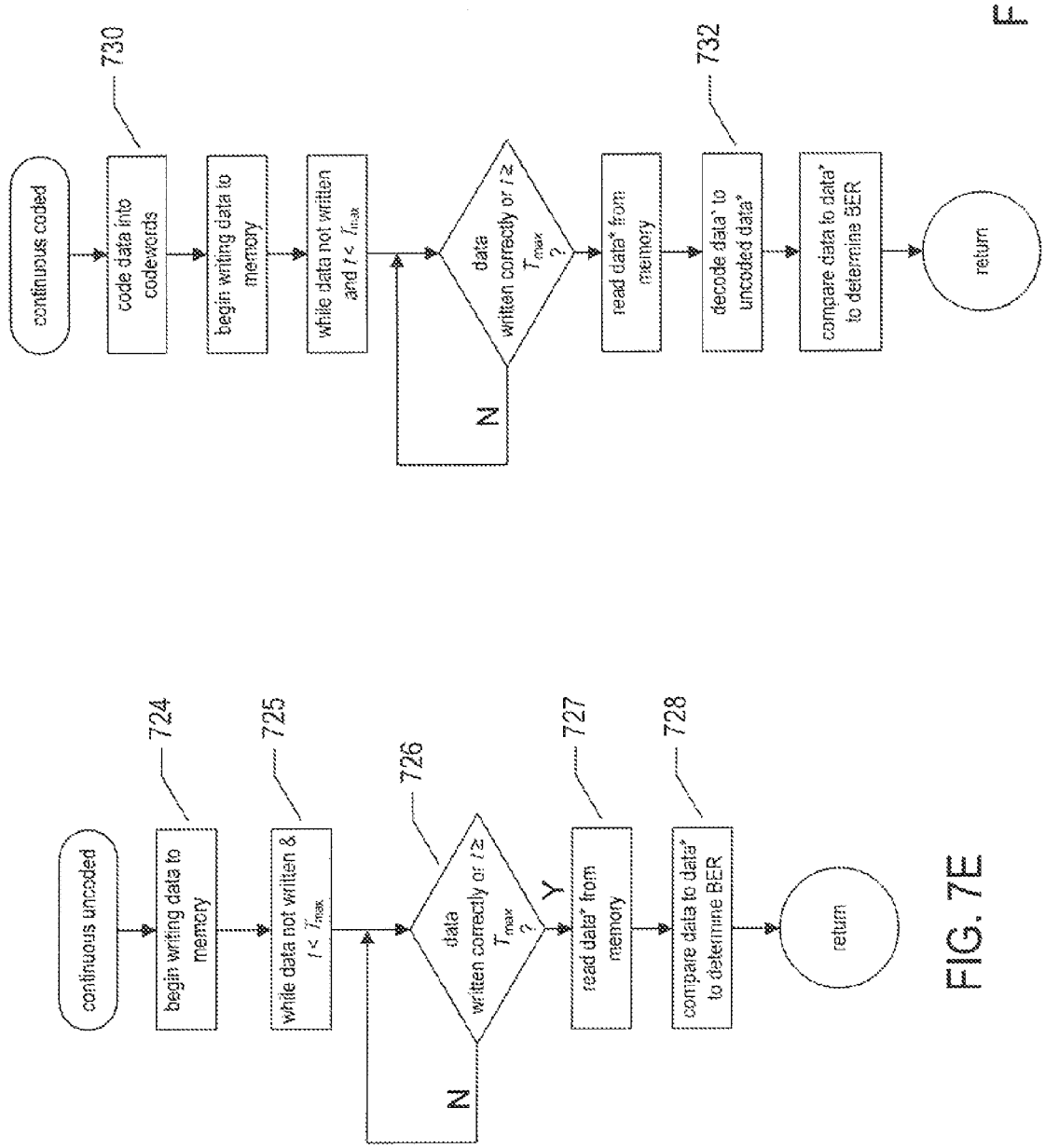

| row | Scheme | $P_b = 10^{-13}$ | | | | $P_b = 10^{-23}$ | | | |
|---|---|---|---|---|---|---|---|---|---|
| | | $T_{avg}$ | $T'_{avg}$ | $T_{max}$ | $\frac{T_{max}}{T_{avg}}$ | gain (dB) | $T_{avg}$ | $T'_{avg}$ | $T_{max}$ | $\frac{T_{max}}{T_{avg}}$ | gain (dB) |
| | Reading cost zero | | | | | | | | | |
| 1 | 1-pulse uncoded | | 53.26 | 53.26 | 1.0 | 0.0 | | 280.27 | 280.27 | 1.0 | 0.0 |
| 2 | 1-pulse coded | 6.72 | 6.39 | 6.39 | 1.0 | 9.0 | | | | | 15.2 |
| 3 | 2-pulse uncoded | | 4.16 | 53.26 | 12.8 | 11.1 | | 5.55 | 280.27 | 50.5 | 17.0 |
| 4 | 2-pulse coded | 2.60 | 2.47 | 6.39 | 2.6 | 13.1 | 2.80 | 2.67 | 8.12 | 3.0 | 20.0 |
| 5 | 3-pulse uncoded | | 2.37 | 53.26 | 22.5 | 13.5 | | 2.62 | 280.27 | 107.2 | 20.3 |
| 6 | 3-pulse coded | 1.98 | 1.89 | 6.39 | 3.4 | 14.3 | 2.06 | 1.96 | 8.12 | 4.1 | 21.3 |
| 7 | continuous uncoded | | 1.17 | 53.26 | 45.4 | 16.6 | | 1.17 | 280.27 | 238.9 | 23.8 |
| 8 | continuous coded | 1.23 | 1.17 | 6.39 | 5.5 | 16.4 | 1.23 | 1.17 | 8.12 | 6.9 | 23.6 |
| | Reading cost $t_r$ | | | | | | | | | |
| 9 | $t_r = \tau/100$ uncoded | 1.39 | 1.32 | 53.37 | 40.5 | 16.1 | 1.39 | 1.32 | 280.23 | 212.9 | 23.3 |
| 10 | $t_r = \tau/100$ coded | 1.32 | 1.32 | 6.35 | 4.8 | 16.5 | 1.32 | 1.32 | 8.23 | 6.25 | 23.1 |
| 11 | $t_r = \tau/10$ uncoded | 1.65 | 1.65 | 53.37 | 32.4 | 15.1 | 1.65 | 1.65 | 280.23 | 170.3 | 22.3 |
| 12 | $t_r = \tau/10$ coded | 1.72 | 1.65 | 6.35 | 3.7 | 14.9 | 1.72 | 1.65 | 8.23 | 5.0 | 22.1 |
| 13 | $t_r = \tau$ uncoded | 3.27 | 3.10 | 53.37 | 17.2 | 12.3 | 3.27 | 3.10 | 280.23 | 90.3 | 19.6 |
| 14 | $t_r = \tau$ uncoded | 3.27 | 3.10 | 6.35 | 2.0 | 12.8 | 3.27 | 3.10 | 8.23 | 2.7 | 19.6 |

FIG. 10

| Scheme | $P_b = 10^{-12}$ | | $P_b = 10^{-23}$ | |
|---|---|---|---|---|
| | Max # pulses | Avg # pulses | Max # pulses | Avg # pulses |
| $t_r = \tau/100$ uncoded | 265 | 7.0 | 796 | 7.0 |
| $t_r = \tau/100$ coded | 49 | 7.0 | 61 | 7.0 |
| $t_r = \tau/10$ uncoded | 87 | 2.6 | 258 | 2.6 |
| $t_r = \tau/10$ coded | 16 | 2.6 | 20 | 2.6 |
| $t_r = \tau$ uncoded | 30 | 1.3 | 88 | 1.3 |
| $t_r = \tau$ coded | 5 | 1.3 | 7 | 1.3 |

FIG. 12

METHOD AND SYSTEM FOR REDUCING WRITE-BUFFER CAPACITIES WITHIN MEMRISTOR-BASED DATA-STORAGE DEVICES

TECHNICAL FIELD

The present application is related to devices that store data in non-linear bit-storage media, such as memristive bit-storage media, and, in particular, to a method and system for reducing write-buffer capacities by encoding data prior to storage.

BACKGROUND

The dimensions of electronic circuit elements have decreased rapidly over the past half century. Familiar circuit elements, including resistors, capacitors, inductors, diodes, and transistors that were once macroscale devices soldered by hand into macroscale circuits are now fabricated at sub-microscale dimensions within integrated circuits. Photolithography-based semiconductor manufacturing techniques can produce integrated circuits with tens of millions of circuit elements per square centimeter. The steady decrease in size of circuit elements and increase in the component densities of integrated circuits have enabled a rapid increase in clock speeds as which integrated circuits can be operated as well as enormous increases in the functionalities, computational bandwidths, data-storage capacities, and efficiency of operation of integrated circuits and integrated-circuit-based electronic devices.

Unfortunately, physical constraints with respect to further increases in the densities of components within integrated-circuits manufactured using photolithography methods are being approached. Ultimately, photolithography methods are constrained by the wave length of radiation passing through photolithography masks in order to fix and etch photoresist and, as dimensions of circuit lines and components decrease further into nanoscale dimensions, current leakage through tunneling and power-losses, due to relatively high resistances of nanoscale components are providing challenges with respect, to further decreasing component sizes and increasing component densities by traditional integrated-circuit-manufacturing and design methodologies. These challenges have spawned entirely new approaches to the design and manufacture of nanoscale circuitry and circuit elements. Research and development efforts are currently being expended to create extremely dense, nanoscale electronic circuitry through self-assembly of nanoscale components, nanoscale imprinting, and other relatively new methods. In addition, new types of circuit elements that operate at nanoscale dimensions have been discovered, including memristive switching materials that can be employed as bistable nanoscale memory elements. Unfortunately, memristive switching materials, and other candidate bistable-memory-element materials, which feature non-linear responses to applied voltage, temperature, and other forces and gradients that are applied to change the state of the materials, often exhibit relatively broadly distributed, asymmetrical probability density functions ("PDFs") that characterize the probabilities that a memory element switches with respect to different durations of time that the switching force or gradient is applied. The asymmetrical PDF may feature a relatively long tail, corresponding to the fact that the force or gradient may need to be applied for a significantly greater period of time, to ensure switching, than the average time for switching. Alternatively, the PDF characterizes the switching behaviors of a large number of memory elements, with the long tall corresponding to a small fraction of the large number of memory elements which switch at significantly longer durations of application of the force or gradient than the majority of the large number of memory elements. This fact, in turn, entails significantly decreased operational bandwidths and/or reliability with respect to theoretical devices with narrowly distributed, symmetrical PDFs, for which the time that a force or gradient needs to be applied in order to ensure switching up to a probability corresponding to a maximum tolerable bit error rate is not significantly greater than the average application time at which switching occurs. Theoreticians, designers, and developers of memory devices and other data-storage devices based on non-linear data-storage materials, such as memristive materials, continue to seek methods and device architectures that ameliorate the asymmetrical, broadly-distributed switching-time characteristics of certain of these devices.

BRIEF DESCRIPTION OF THE DRAWINGS

FIG. 5 illustrates a second approach to ameliorating the effects of log-normal distributed switching times for memristive memory elements and other bistable data-storage materials.

FIGS. 7A-F illustrate six different data-writing methods for writing data to a memory device that includes memory elements characterized by log-normally distributed switching times.

FIG. 10 provides a table showing comparisons of a number of different WRITE methods for writing data into a memory that includes memory elements characterized by log-normally distributed switching times.

FIG. 12 provides a table that lists the maximum number of pulses and average number of pulses for multi-pulse WRITE methods that achieve desired switching-failure probabilities for considered READ times that are various different fractions of $\tau$.

DETAILED DESCRIPTION

The present application is directed to electronic data-storage devices that store data in memory elements characterized by relatively broad and/or asymmetric switching-time probability density functions. These types of memory elements, many of which incorporate non-linear, bistable materials, including memristive materials, may exhibit worst-case switching times that are significantly larger than average switching times. The probability distributions reflect the switching times observed when a memory element is repeatedly switched from a first bistable state to a second bistable state. The probability distributions also reflect the observed switching times of a large number of individual memory elements when a switching voltage, current, or other force or gradient is applied to the large number of memory elements. The potentially lengthy switching times result, for conventional data-storage devices, in relatively long switching cycles and correspondingly low data-storage-input bandwidths.

The electronic data-storage devices to which the current application is directed are discussed below m six subsections: (1) Overview of Memory Elements with Asymmetrically-Distributed Switching Times; (2) Error Control Coding; (3) Hypothetical WRITE methods; (4) Analysis of the Various WRITE Methods; (5) Results of the Analysis of the Various WRITE Methods; and (6) Examples of Electronic Data-Storage Devices to which the Current Application is Directed.

Overview of Memory Elements with
Asymmetrically-Distributed Switching Times

Figure 1A:
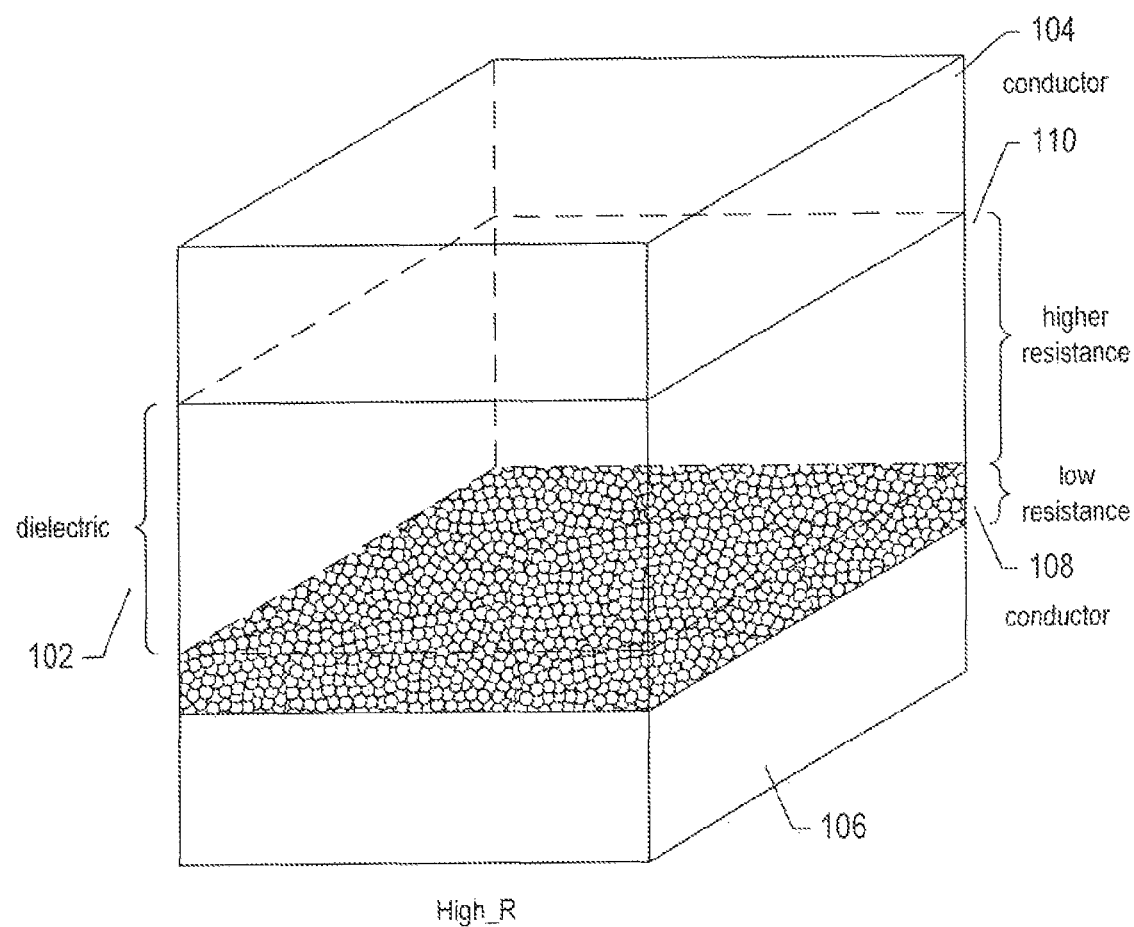
FIGS. 1A-B illustrate an example nanoscale single-bit data-storage device that features two stable electronic states.
Figure 1B:
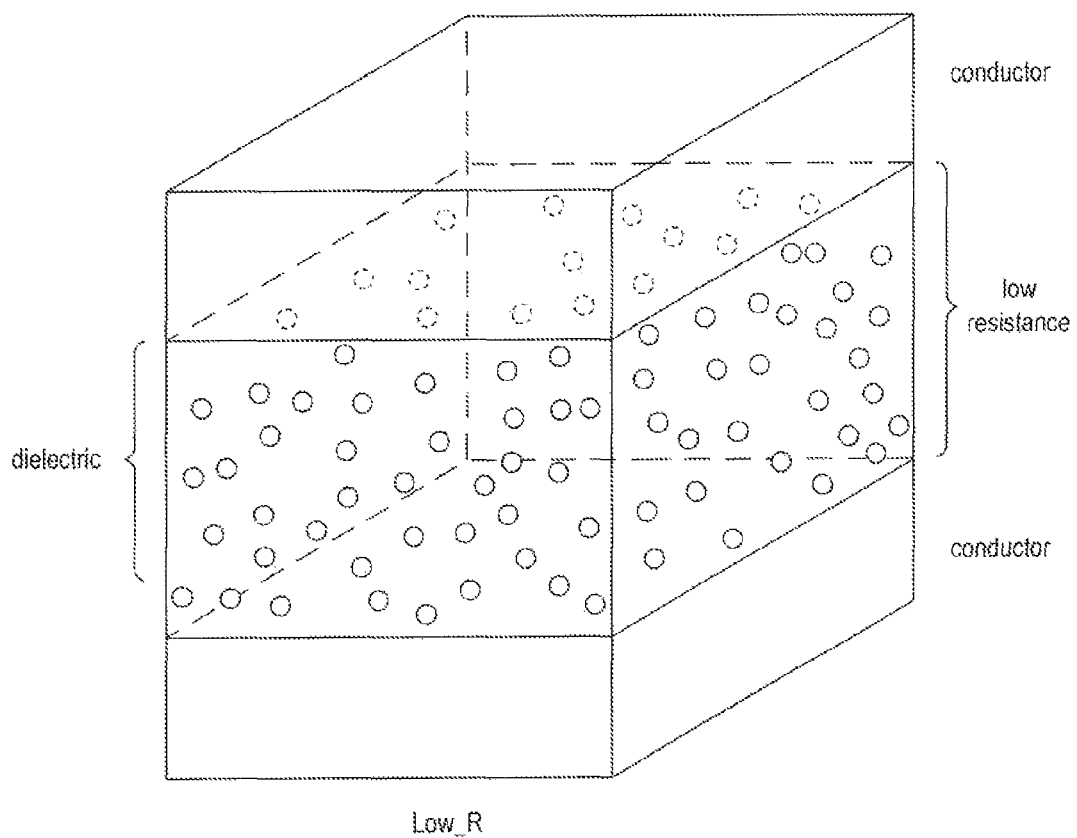

FIGS. 1A-B illustrate an example nanoscale single-bit data-storage device that features two stable electronic states. FIG. 1A shows the device in a relatively high-resistance state and FIG. 1B shows the device in a relatively low-resistance state. The resistivity of a dielectric material between electrodes can be electronically sensed, and thus the two different resistance states shown in FIGS. 1A-B can be used to store a single bit of information.

FIGS. 1A-B both use the same illustration conventions. In FIG. 1A, a dielectric material 102 is sandwiched between two conductive electrodes 104 and 106. Those portions of the electrodes overlying and underlying the bistable dielectric material 102 are shown in FIG. 1A. In general the electrodes may be nanowires or other conductive elements that electrically interconnect the nanoscale electronic device with other nanoscale electronic devices, nanoscale circuitry, and, ultimately, microscale and macroscale circuitry. In FIG. 1, the dielectric material 102 is shown to have two different portions; (1) a low-resistivity portion 108 and a higher-resistivity portion 110. The low-resistivity portion is a depletion region that includes, as one example, oxygen vacancies that facilitate current conduction. The higher-resistivity portion 110 of the dielectric material lacks the vacancies, and thus has the conductance of an undoped semiconductor or dielectric substance. When a sufficiently large-magnitude voltage is applied across the dielectric material in an upward vertical direction, or z direction, in FIGS. 1A-B, the oxygen vacancies can be redistributed within the dielectric material between the two electrodes as shown in FIG. 1B. Redistribution of the oxygen vacancies results in the dielectric material having a relatively low resistance throughout. Applying a sufficiently large voltage in the opposite direction, or negative voltage in the upward, vertical direction in FIG. 1B, results in forcing the vacancies to distribute themselves nearer to the lower electrode, as in FIG. 1A.

Figure 2:
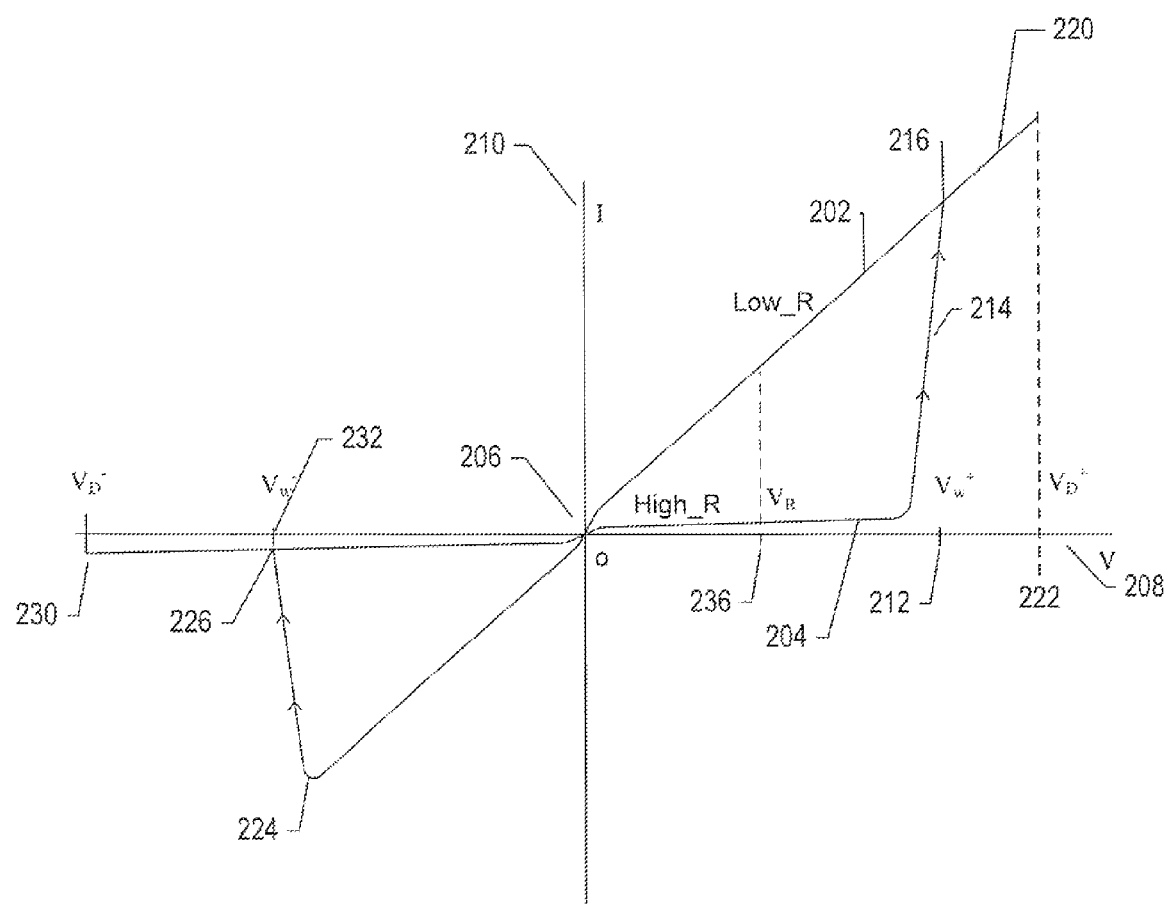
FIG. 2 shows current versus voltage behavior of the bistable nanoscale electronic device illustrated in FIGS. 1A-B.

FIG. 2 shows current versus voltage behavior of the bistable nanoscale electronic device illustrated in FIGS. 1A-B. The portion of the I-V curve with relatively large slope 202 is the portion of the I-V curve corresponding to the low-resistance state of the nanoscale electronic device, illustrated in FIG. 1B. The slope of this curve is proportional to the conductivity and inversely proportional to the resistivity of the dielectric material between the two electrodes. The portion of the I-V curve with a small-magnitude slope 204 corresponds to the high-resistance state of the nanoscale electronic device shown in FIG. 1A. Beginning at the origin 206 of the voltage 208 and current 210 axes, and assuming that the nanoscale electronic device is in the high-resistance state shown in FIG. 1A, application of increasing positive voltage from the lower electrode to the upper electrode results in a very small increase in current across the dielectric material as represented by the right-hand portion of the I-V curve 204, until the applied positive voltage nears the voltage $V_w^+$ 212, at which point the oxygen vacancies are rapidly redistributed throughout the dielectric or semi-conductive material, as a result of which the current rapidly increases, as represented by the nearly vertical portion of the I-V curve 214, until the portion of the I-V curve representing the low-resistance state is reached at point 216. Further increase in the positive voltage results in a relatively large, corresponding increase in current, along the far right portion of the low-resistance-state I-V curve 220 until a voltage $V_D^+$ 222 is reached, at which point the device fails due to generation of excessive amounts of heat as a result of resistive heating by the high current passing through the device. Once the low-resistance state is reached, at point 216, then as the voltage applied across the electrodes is decreased, the low-resistance-state I-V curve 202 is followed leftward, descending back to the origin 206, and, as voltage is further decreased to negative voltages of increasing magnitude, the current switches in direction and increases in magnitude to point 224, at which point oxygen vacancies are again redistributed back to a dense layer near the tower electrode, as shown in FIG. 1A, leading to a rapid decrease in the magnitude of the current flowing through the device and a return to the high-resistance state at point 226. Further increase in the magnitude of the negative voltage applied across the device eventually leads to the voltage $V_D^-$ 230, at which point the device again fails due to resistive heating.

The voltage at which the nanoscale electronic device transitions from the low-resistance state to the high-resistance state is referred to as $V_w^-$ 232. Choosing the high-resistance state to represent Boolean value "0" and the low-resistance state to represent Boolean value "1," application of the positive voltage $V_w^+$ can be considered to be a WRITE-1 operation and application of the negative voltage $V_w^-$ can be considered to be a WRITE-0 operation. Application of an intermediate-magnitude voltage $V_R$ 236 can be used to interrogate the value currently stored in the nanoscale electronic device. When the voltage $V_R$ is applied to the device, and when, as a result a relatively large magnitude current flows through the device, the device is in the low-resistance, or Boolean 1 state, but when relatively little current passes through the device, the device is in the Boolean 0 state. Thus, the nanoscale electronic device illustrated in FIGS. 1A-B and FIG. 2 can serve as a nanoscale memory element, and two-dimensional or three-dimensional arrays of such devices can be employed as two-dimensional and three-dimensional memory arrays.

Although this example, and a subsequent example, feature bistable materials that, can have either of two different stable electronic states, depending on the history of voltages applied across the device, devices with three or more stable states can also be used in various applications. For example, a device with three stable states can store one of three different values "0," "1," or "2," of a base-3 number system, or two of the three stable states of the three-state device can be used for storing a bit value, with the non-assigned state providing further separation from the information-storing states. In many cases, voltage is applied to change the state of a bistable memory element. However, other types of bistable materials may be switched by application of other forces and/or gradients, including temperature for phase-change-material-based devices. Other types of devices may feature types of states other than electrical-resistance states.

Figure 3A:
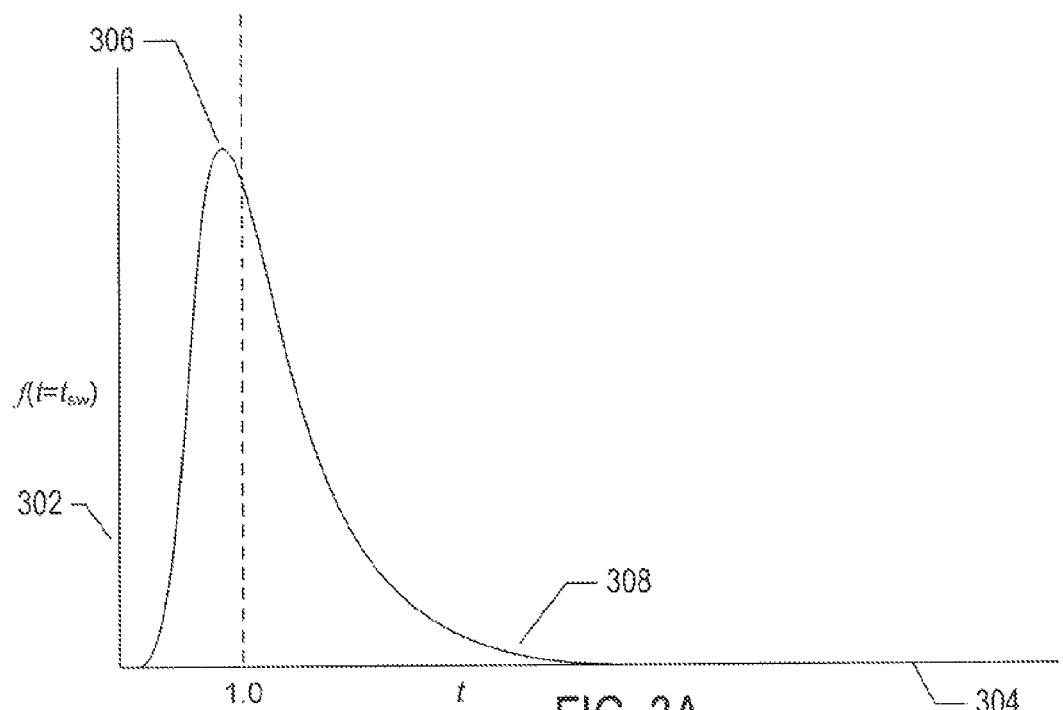
FIG. 3A illustrates a log-normal probability density function ("PDF").

FIG. 2, discussed above, provides a type of idealized description of memristor switching. However, memristive memory elements, and other types of memory elements that exhibit non-linear characteristics under applied voltages or other forces or gradients do not uniformly switch from one bistable state to another with respect to time, but instead, as with many other physical phenomena, exhibit switching times that are probabilistically distributed. Certain memristive memory elements, as one example, exhibit switching times that can be modeled by a log-normal probability distribution. FIG. 3A illustrates a log-normal probability density function ("PDF"). In FIG. 3A, the vertical axis 302 represents the probability density that a particular memristive memory element switches at a time t relative to the starting time for the application of the force or gradient, or, in other words, that time t is equal to the switching time $t_{sw}$ for the device during application of the force or gradient used to switch the memristive memory element from a first state to a second state. In FIG. 3A, the horizontal axis 304 represents time t, with the origin corresponding to a time t=0 when application of the force or gradient is initiated.

For the hypothetical log-normal distribution shown in FIG. 3A, the mean switching time t is 1.0, where the unit of time, such as nanoseconds, microseconds, or milliseconds, depends on the particular memristive material and is irrelevant to the current discussion. In a normal probability distribution, or Gaussian distribution, the peak of the probability density function coincides with the mean value of the random variable. However, as can be seen in FIG. 3A, the peak 306 of the probability density function for the log-normal distribution is shifted to the left of the mean value for the independent variable t. The PDF is asymmetrical, unlike a normal or Gaussian PDF, and features an extended right-hand tail 308 corresponding to the fact that there is a significant probability that the actual switching time of a particular memristive memory element to which a voltage or other force or gradient is applied may occur at a time significantly greater than the average or mean switching time.

Figure 3B:
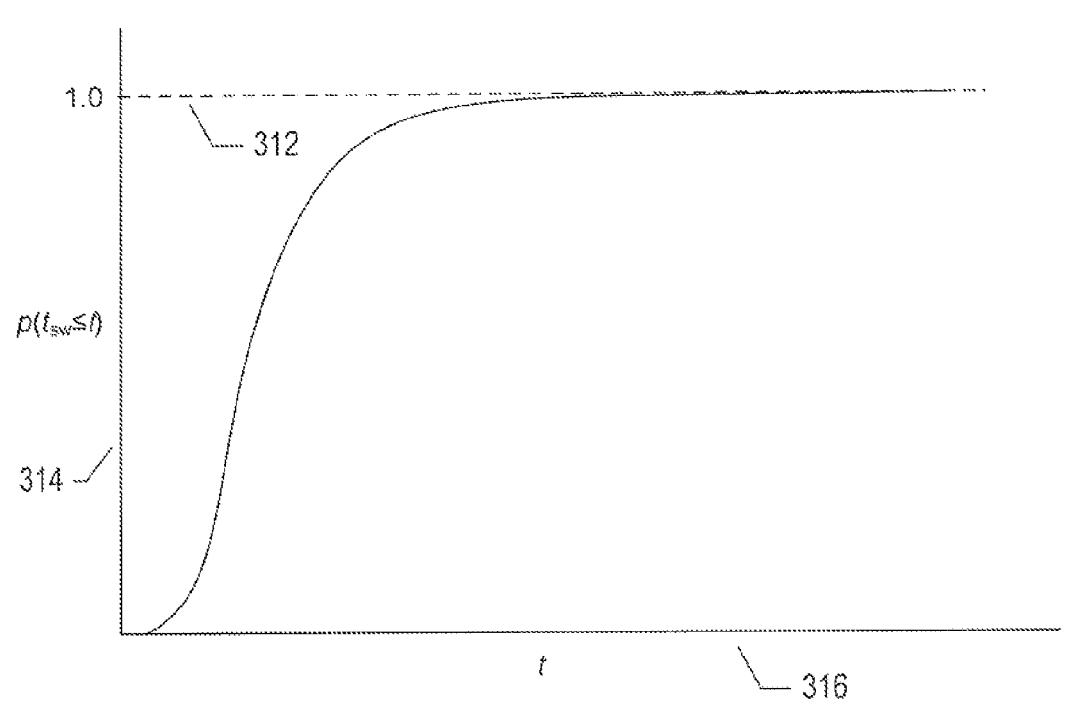
FIG. 3B shows the corresponding cumulative distribution function ("CDF") for the log-normal distribution PDF shown in FIG. 3A.

For many types of electronic devices, including memories, commercial applications demand extremely low error rates. As a result, in order to ensure that a sufficient portion of the memory elements written during a particular application of a write voltage to the memory do indeed switch, the WRITE voltage may need to be applied to the memory for a duration many times that of the average switching time for memory elements or, in other words, for a duration of time such that, for a normalized PDF, the area under the PDF between 0 and the application time approaches 1.0 and the area under the PDF to the right of the duration of application approaches 0. FIG. 3B shows the corresponding cumulative distribution function ("CDF") for the log-normal distribution PDF shown in FIG. 3A. The vertical axis 314 represents the probability of the switching time for a memristive memory element, $t_{sw}$, being less than or equal time t, and the horizontal axis represents time t. The CDF exhibits a relatively extended, shallow approach 310 to the horizontal dashed line that represents a probability of 1.0 corresponding to the extended right-hand tail of the PDF.

A suitable expression for modeling the PDF for a memristive memory element is provided below:

$$f_{\tau,\sigma}(t) = \frac{1}{\sqrt{2\pi}\, t\sigma} e^{\frac{-(\ln t/\tau)^2}{2\sigma^2}}.$$

A suitable expression for modeling the CDF for a memristive memory element is next provided:

$$F_{\tau,\sigma}(t) = \frac{1}{2}\mathrm{erfc}\left(-\frac{\ln(t/\tau)}{\sqrt{2}\,\sigma}\right).$$

In the above expression, the function erfc denotes the complementary error function. The PDF and CDF can be viewed as expressions for the distribution of t/τ, where the median value of ln(t/τ) is 0 and ln(t/τ) is Gaussian distributed. The ratio t/τ represents switching times normalized by the median switching time τ. The parameter τ is modeled, in certain types of memristive memory elements, by the following expressions:

$$\tau_{ON} = a_{ON} e^{-b_{ON}|v|}, 3.5V \le v \le 7V$$

$$\tau_{OFF} = a_{OFF} e^{-b_{OFF}|v|}, -4.75V \le v \le -2.75V$$

$\tau_{ON}$ is the τ parameter for positive applied voltages, which switch the memristive memory element into the ON or "1" state, and $\tau_{OFF}$ is the parameter τ for negative applied voltages that switch the memristive memory element from the "1" or ON state to the "0" or OFF state. The constants $a_{ON}$, $a_{OFF}$, $b_{ON}$, and $b_{OFF}$ are empirically determined positive real constants and v is the applied switching voltage.

Figure 4:
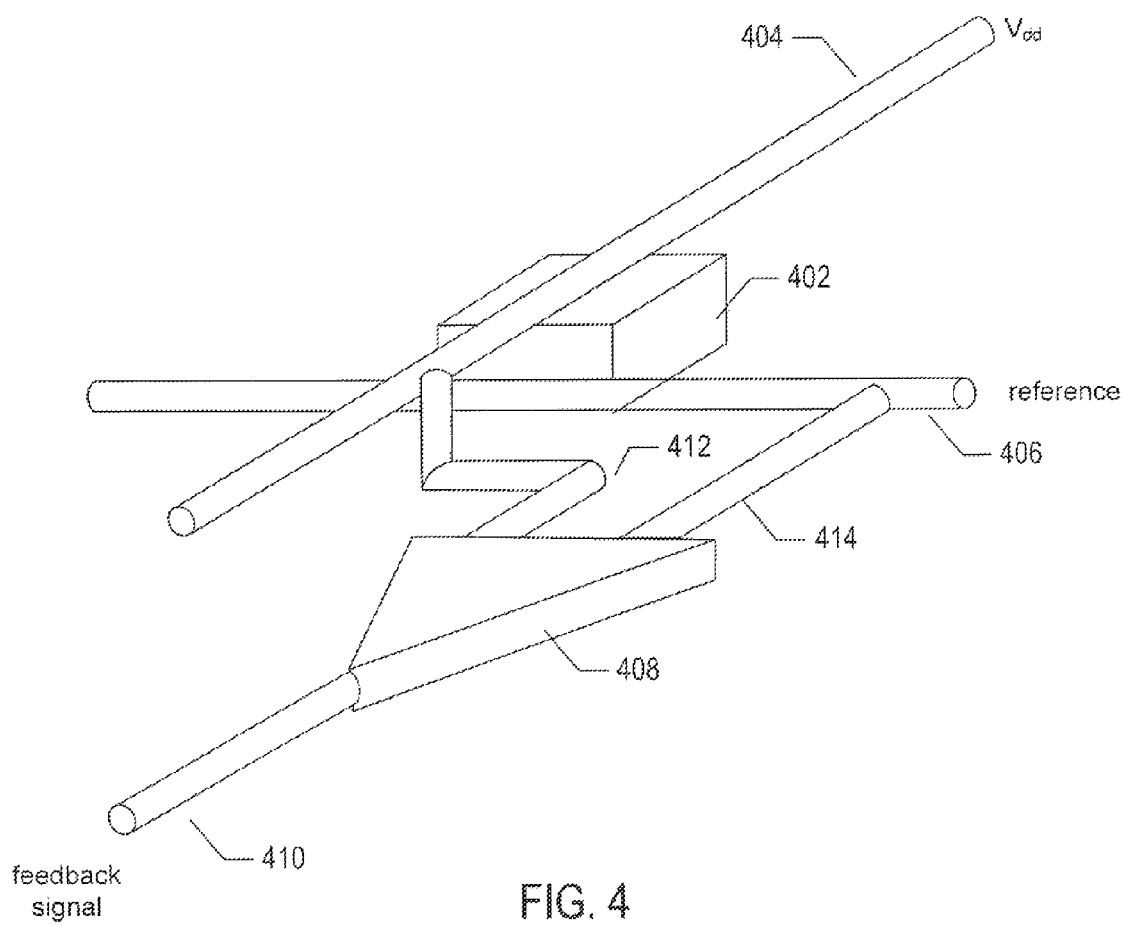
FIG. 4 illustrates a first of the two approaches for ameliorating the effects of log-normal distribution of switching times, memristive memory elements, and other non-linear data-storage materials.

There are two approaches, employed in various examples, for designing and producing cost-effective memory and other data-storage devices, using memory elements characterized by log-normal and/or broadly distributed switching-time PDFs, with desirable data-input bandwidths. These two approaches can each be used separately or in combination. FIG. 4 illustrates a first of the two approaches for ameliorating the effects of log-normal distribution of switching times exhibited by memristive memory elements and other non-linear data-storage materials. FIG. 4 shows s single one-hit memory element 402 sandwiched between two conductors 404 and 406 through which READ and WRITE voltages are applied to the memory element. In addition, the memory element is associated with a circuit element 408, modeled in FIG. 4 as a circuit element which outputs a feedback signal 410 that depends on the voltage difference between two input signals 412 and 414. In this model, for example, a feedback signal may have one voltage value when a positive WRITE voltage is applied through conductors 404 and 406 and the memory element 402 is in a first of two bistable resistance states and may have a different voltage value when a WRITE voltage is applied through conductors 404 and 406 and the memory element 402 is in a second of two bistable resistance states. The feedback signal 410 thus informs a WRITE controller or other memory circuitry of the current state of the memory element. This allows, as one example, for a WRITE voltage to be applied to the memory element for as long as needed to switch the memory element from a first state to a second state. Thus, as one example, rather than applying a WRITE voltage for a sufficient time to ensure that the memory element has switched to some degree of certainty, where the sufficient time is computed from the PDF characterizing the memory element, the WRITE voltage is applied for a sufficient time to actually switch the memory element. As discussed above with reference to FIG. 3A, the WRITE-voltage application time needed to ensure switching to a high degree of certainty may be many times longer than the average switching time of a particular memristive memory element, and thus the feedback signal generally leads to a significantly shorter average voltage-application time.

FIG. 5 illustrates a second approach to ameliorating the effects of log-normal distributed switching times for memristive memory elements and other bistable data-storage materials. In FIG. 5, an input quantity of binary data 502, represented as a long array of bit values, with each cell in the array storing a single bit value, is broken up into a number of subarrays of length k 504-507. These k arrays are then encoded, using one of numerous different types of error-control codes ("ECCs"), which results in the addition of r redundant bits to each subarray of length k 510. The encoded subarrays are then stored in a memory 512. When the stored data is retrieved from the memory during a read operation 514, the encoded stored information is decoded by decode logic 516 to produce the k-length subarrays 520-523. In general, as discussed in a subsection below, the addition of r redundant bits of information to each k-length subarray allows up to a certain number of incorrectly stored or incorrectly read bits within each k-length subarray to be corrected by the decode logic. Thus, a certain number of bit errors may be suffered, in the WRITE/READ process, by the memory without leading to erroneous data. Using ECCs, as one example, the length of time during which WRITE voltages are applied may be significantly shortened while achieving the same error rate achieved by using longer application of WRITE voltages but writing and reading uncoded information.

Error Control Codes

Excellent references for error-control coding are the textbooks "Error Control Coding: Fundamentals and Applications," Lin and Costello, Prentice-Hall Incorporated, New Jersey, 1983 and "Introduction to Coding Theory," Ron M. Roth, Cambridge University Press, 2006. A brief description of the error-defection and error-correction techniques used in error-control coding is next provided. Additional details can be obtained from the above-referenced textbooks or from many other textbooks, papers, and journal articles in this field.

Error-control encoding techniques systematically introduce supplemental bits or symbols into plain-text messages, or encode plain-text messages using a greater number of bits or symbols than absolutely required, in order to provide information in encoded messages to allow for errors arising in storage or transmission to be detected and, in some cases, corrected. One effect of the supplemental or more-than-absolutely-needed bits or symbols is to increase the distance between valid codewords, when codewords are viewed as vectors in a vector space and the distance between codewords is a metric derived from the vector subtraction of the codewords.

In describing error detection and correction, it is useful to describe the data to be transmitted, stored, and retrieved as one or more messages, where a message µ comprises an ordered sequence of symbols, $\mu_i$, that are elements of a field F. A message µ can be expressed as:

$$\mu = (\mu_0, \mu_1, \ldots, \mu_{k-1})$$

where $\mu_i \in F$.

The field F is a set that is closed under multiplication and addition, and that includes multiplicative and additive inverses. It is common, in computational error detection and correction, to employ finite fields, $GF(p^m)$, comprising a subset of integers with size equal to the power m of a prime number p, with the addition and multiplication operators defined as addition and multiplication modulo an irreducible polynomial over GF(p) of degree m. In practice, the binary field GF(2) or a binary extension held $GF(2^m)$ is commonly employed, and the following discussion assumes that the field GF(2) is employed. Commonly, the original message is encoded into a message c that also comprises an ordered sequence of elements of the field GF(2), expressed as follows:

$$c = (c_0, c_1, \ldots c_{n-1})$$

where $c_i \in GF(2)$.

Block encoding techniques encode data in blocks. In this discussion, a block can be viewed as a message µ comprising a fixed number of symbols k that is encoded into a message c comprising an ordered sequence of n symbols. The encoded message c generally contains a greater number of symbols than the original message µ, and therefore n is greater than k. The r extra symbols in the encoded message, where r equals n−k, are used to carry redundant check information to allow for errors that arise during transmission, storage, and retrieval to be detected with an extremely high probability of detection and, in many cases, corrected.

In a linear block code, the $2^k$ codewords form a k-dimensional subspace of the vector space of all n-tuples over the field GF(2). The Hamming-weight of a codeword is the number of non-zero elements in the codeword, and the Hamming distance between two codewords is the number of elements in which the two codewords differ. For example, consider the following two codewords a and b, assuming elements from the binary field:

$$a = (1\ 0\ 0\ 1\ 1)$$

$$b = (1\ 0\ 0\ 0\ 1)$$

The codeword a has a Hamming weight of 3, the codeword h has a Hamming weight of 2, and the Hamming distance between codewords a and b is 1, since codewords a and b differ in the fourth element. Linear block codes are often designated by a three-element tuple [n, k, d], where n is the codeword length, k is the message length, or, equivalently, the base-2 logarithm of the number of codewords, and d is the minimum Hamming distance between different codewords, equal to the minimal-Hamming-weight, non-zero codeword in the code.

The encoding of data for transmission, storage, and retrieval and subsequent decoding of the encoded data, can be nationally described as follows, when no errors arise during the transmission, storage, and retrieval of the data:

$$\mu \rightarrow c(s) \rightarrow c(r) \rightarrow \mu$$

where c(s) is the encoded message prior to transmission, and c(r) is the initially retrieved or received, message. Thus, an initial message μ is encoded to produce encoded message c(s) which is then transmitted, stored, or transmitted and stored, and is then subsequently retrieved or received as initially received message c(r). When not corrupted, the initially received message c(r) is then decoded to produce the original message μ. As indicated above, when no errors arise, the originally encoded message c(s) is equal, to the initially received message c(r), and the initially received message c(r) is straightforwardly decoded, without error correction, to the original message μ.

When errors arise during the transmission, storage, or retrieval of an encoded message, message encoding and decoding can be expressed as follows:

$$\mu(s) \rightarrow c(s) \rightarrow c(r) \rightarrow \mu(r).$$

Thus, as stated above, the final message μ(r) may or may not be equal to the initial message μ(s), depending on the fidelity of the error detection and error correction techniques employed to encode the original message μ(s) and decode or reconstruct the initially received message c(r) to produce the final received message μ(r). Error detection is the process of determining that:

$$c(r) \neq c(s)$$

while error correction is a process that reconstructs the initial, encoded message from a corrupted initially received message:

$$c(r) \neq c(s).$$

The encoding process is a process by which messages, symbolized as μ are transformed into encoded messages c. Alternatively, a message μ can be considered to be a word comprising an ordered set of symbols from the alphabet consisting of elements of F, and the encoded messages c can be considered to be a codeword also comprising an ordered set of symbols from the alphabet of elements of F. A word μ can be any ordered combination of k symbols selected from the elements of F, while a codeword c is defined as an ordered sequence of n symbols selected from elements of F via the encoding process:

$$\{c : \mu \rightarrow c\}.$$

Linear block encoding techniques encode words of length k by considering the word μ to be a vector in a k-dimensional vector space, and multiplying the vector μ by a generator matrix, as follows:

$$c = \mu \cdot G.$$

Notationally expanding the symbols in the above equation produces either of the following alternative expressions:

$$(c_0, c_1, \ldots, c_{n-1}) = (\mu_0, \mu_1, \ldots, \mu_{k-1}) \begin{pmatrix} g_{00} & g_{01} & g_{02} & \cdots & g_{0,n-1} \\ \vdots & & \ddots & & \vdots \\ g_{k-1,0} & g_{k-1,1} & g_{k-1,2} & \cdots & g_{k-1,n-1} \end{pmatrix}$$

$$(c_0, c_1, \ldots, c_{n-1}) = (\mu_0, \mu_1, \ldots, \mu_{k-1}) \begin{pmatrix} g_0 \\ g_1 \\ \vdots \\ \vdots \\ \vdots \\ g_{k-1} \end{pmatrix}$$

where $g_i = (g_{i,0}, g_{i,1}, g_{i,2} \cdots g_{i,n-1})$.

The generator matrix G for a linear block code can have the form:

$$G_{k,n} = \begin{pmatrix} p_{0,0} & p_{0,1} & \cdots & p_{0,n-1} & 1 & 0 & 0 & \cdots & 0 \\ p_{1,0} & p_{1,1} & \cdots & p_{1,n-1} & 0 & 1 & 0 & \cdots & 0 \\ \vdots & \vdots & \cdots & & 0 & 0 & 1 & \cdots & 0 \\ \vdots & \vdots & \cdots & & \vdots & \vdots & \vdots & \cdots & \vdots \\ \vdots & \vdots & \cdots & & \vdots & \vdots & \vdots & \cdots & \vdots \\ p_{k-1,0} & p_{k-1,1} & \cdots & p_{k-1,n-1} & 0 & 0 & 0 & \cdots & 1 \end{pmatrix}$$

or, alternatively;

$$G_{k,n} = [P_{k,r} | I_{k,k}].$$

Thus, the generator matrix G can be placed into a form of a matrix P augmented with a k by k identity matrix $I_{k,k}$. Alternatively, the generator matrix G can have the form:

$$G_{k,n} = [I_{k,k} | P_{k,r}].$$

A code generated by a generator matrix in this form is referred to as a "systematic code." When a generator matrix having the first form, above, is applied to a word μ, the resulting codeword c has the form:

$$c = (c_0, c_1, \ldots, c_{r-1}, \mu_0, \mu_1, \ldots, \mu_{k-1})$$

where $c_i = \mu_0 p_{0,i} + \mu_1 p_{1,i}, \ldots, \mu_{k-1} p_{k-1,i}$. Using a generator matrix of the second form, codewords are generated with trading parity-check bits. Thus, in a systematic linear block code, the codewords comprise r parity-check symbols $c_i$ followed by the k symbols comprising the original word μ or the k symbols comprising the original word μ followed by r parity-check symbols. When no errors arise, the original word, or message μ, occurs in clear-text form within, and is easily extracted from, the corresponding codeword. The parity-check symbols turn out to be linear combinations of the symbols of the original message, or word μ.

One form of a second, useful matrix is the parity-check matrix $H_{r,n}$ defined as:

$$H_{r,n} = [I_{r,r} | -P^T]$$

or equivalently, $$H_{r,n} = \begin{pmatrix} 1 & 0 & 0 & \cdots & 0 & -p_{0,0} & -p_{1,0} & -p_{2,0} & \cdots & -p_{k-1,0} \\ 0 & 1 & 0 & \cdots & 0 & -p_{0,1} & -p_{1,1} & -p_{2,1} & \cdots & -p_{k-1,1} \\ 0 & 0 & 1 & \cdots & 0 & -p_{0,2} & -p_{1,2} & -p_{2,2} & \cdots & -p_{k-1,2} \\ \vdots & \vdots & \vdots & \cdots & \vdots & \vdots & \vdots & \vdots & \cdots & \vdots \\ 0 & 0 & 0 & \cdots & 1 & -p_{0,r-1} & -p_{1,r-1} & -p_{2,r-1} & \cdots & -p_{k-1,r-1} \end{pmatrix}.$$

The parity-check matrix can be used for systematic error detection and error correction. Error detection and correction involves computing a syndrome S from an initially received or retrieved message c(r) as follows:

$$S=(s_0, s_1, \ldots, s_{r-1}) = c(r) \cdot H^T$$

where $H^T$ is the transpose of the parity-check matrix $H_{r,n}$ expressed as:

$$H^T = \begin{pmatrix} 1 & 0 & 0 & \ldots & 0 \\ 0 & 1 & 0 & \ldots & 0 \\ 0 & 0 & 1 & \ldots & 0 \\ \vdots & \vdots & \vdots & \ldots & 1 \\ -p_{0,0} & -p_{0,1} & -p_{0,2} & \ldots & -p_{0,r-1} \\ -p_{1,0} & -p_{1,1} & -p_{1,2} & \ldots & -p_{1,r-1} \\ -p_{2,0} & -p_{2,1} & -p_{2,2} & \ldots & -p_{2,r-1} \\ \vdots & \vdots & \vdots & \ldots & \vdots \\ -p_{k-1,0} & -p_{k-1,1} & -p_{k-1,2} & \ldots & -p_{k-1,r-1} \end{pmatrix}.$$

Note that, when a binary field is employed, x=−x, so the minus signs shown above in $H^T$ are generally not shown.

The syndrome S is used for error detection and error correction. When the syndrome S is the all-0 vector, no errors are detected in the codeword. When the syndrome includes bits with value "1," errors are indicated. There are techniques for computing an estimated error vector ê from the syndrome and codeword which, when added by modulo-2 addition to the codeword, generates a best estimate of the original message μ. Details for generating the error vector ê are provided in the above mentioned texts. Note that up to some maximum number of errors can be detected, and fewer than the maximum number of errors that can be detected can be corrected.

Figure 6A:
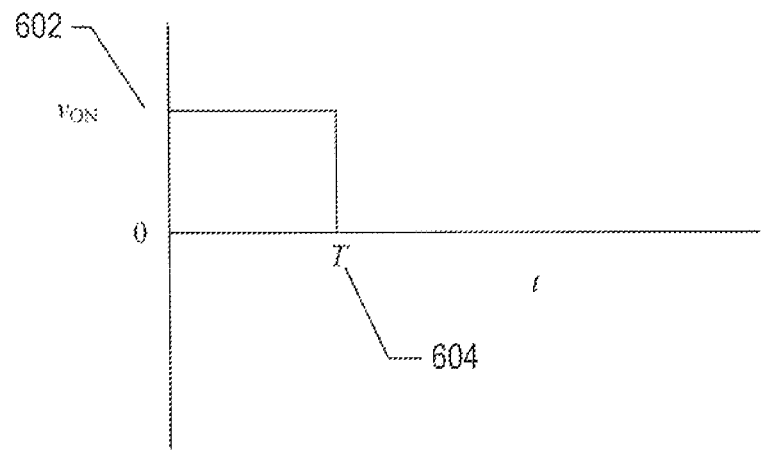
FIGS. 6A-B illustrate application of a switching pulse to a memristive memory element, or other non-linear data-storage material.
Figure 6B:
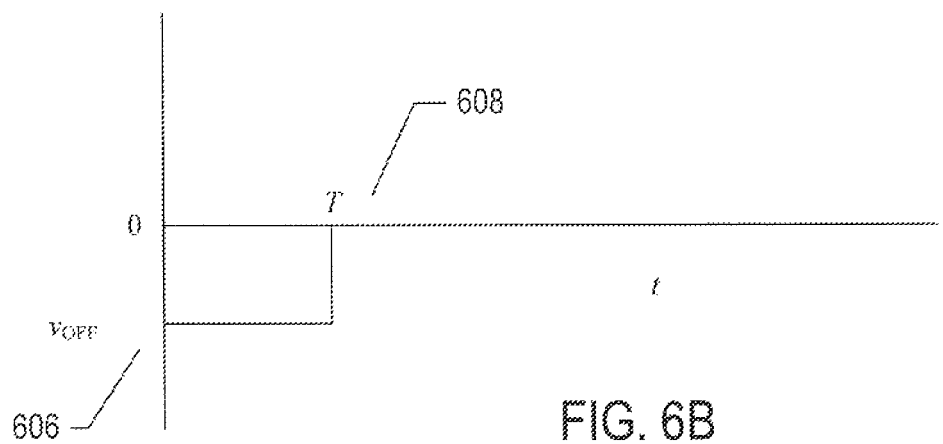

FIGS. 6A-B illustrate application of a switching pulse to a memristive memory element, or other non-linear data-storage material. For much of the following discussion, application of a switching pulse or multiple switching pulses is considered. A switching pulse may be either application of a positive voltage, $v_{ON}$ 602 for a time duration t 604 or application of a negative voltage $v_{OFF}$ 606 for a time duration t 608. In either case, the proper τ parameter is selected from $\tau_{ON}$ and $\tau_{OFF}$ for computing an appropriate log-normal switching-time PDF and corresponding CDF from which the duration of a pulse T can be determined, where T is in units of multiples of the average switching time, that provides a probability that the memory elements switches above a specified minimum switching probability corresponding to a maximum desirable bit-error rate ("BER").

The probability of a switching failure, $P_b(T)$, for a given memory element, or the bit-error rate for a multi-memory-element device, is computed from the above-discussed log-normal CDF as follows:

$$P_b(T) = 1 - F_{\tau,\sigma}(T), T \geq 0.$$

where $F_{\tau,\sigma}(T)$ is the above-discussed CDF. In the following discussion, for simplicity, the asymmetry between on-switching and off-switching is ignored, as are cases in which a successfully applied WRITE operation does not change the state of a memory element and, therefore, failure of the WRITE operation does not change the state of a memory element. Ignoring these cases does not alter comparisons between various methods, discussed below. In the following discussion, switching failure of memristive memory elements and other non-linear data-storage materials is modeled as a binary symmetric noisy channel.

In the following discussion, when ECCs are employed, it is assumed that the code C is an [n,k,d] code and that, therefore, up to (d−1)/2 bit errors that occur in writing and/or reading each codeword can be corrected. Of course, the ability to recover from bit errors comes at the cost of the redundant bits r that are added to each group of binary information bits of length A, resulting in an information rate R defined as:

information rate=R=k/n

R<1 for coded information

R=1 for encoded information.

As discussed above, when uncoiled information is stored into and retrieved from a memory, the fraction of erroneous bits in the retrieved information from memory, assuming that no errors occur during reading of the stored information, is $P_b$, the probability of switching failure or BER. When coded information is stored into a memory, subsequently retrieved, and processed by an error-correcting decoder, the BER $\hat{P}_b$ is:

$$\hat{P}_b = \frac{1}{n} \sum_{i=s+1}^{n} i \binom{n}{i} p_b^i (1-p_b)^{n-i}$$

where $s = \lfloor (d-1)/2 \rfloor$ = maximum number of bits correctable by code C, an [n,k,d] code In this expression, the probabilities of all error patterns including a number of errors that exceeds the maximum number of errors that can be corrected by the ECC are summed together and divided by n, the length of the codewords.

Next a number of different data-writing methods that employ one or both of feedback signals and ECC discussed above with reference to FIGS. 4 and 5, are considered. First, various notational conventions used in these discussions are outlined.

For single-pulse methods, the total time of application of a WRITE voltage, $T_t$, or other force or gradient used to switch a memory element, is equal to T, the duration of the single pulse. For multiple-pulse methods, $T_t$ is equal to the sum of the multiple pulses:

$$T_t = T_0 + \ldots + T_1.$$

The average voltage-application time, $T_{avg}$, is the expected total application time:

$$T_{avg} = E(T_t).$$

For single-pulse methods, $T_{avg} = T$. The average voltage-application time per bit for methods that employ ECC, $T^*_{avg}$, is:

$$T^*_{avg} = T_{avg}/R = \text{pulse time/bit},$$

accounting for the additional time for writing the added redundant bits. Finally, the gain G or expected savings in energy consumption or memory bandwidth per information hit for s particular data-writing method w, is:

$$G = 10 \log_{10} \frac{T_{avg,t}}{T^*_{avg,w}}$$

where G is expressed in dB:

$T_{avg,t}$ is the expected pulse length for the uncoded, one-pulse scheme discussed below:

$T_{avg,w}$ is the average pulse time, per bit, for the particular data-writing method.

Thus, the following comparisons, uncoded BERs $P_b$, coded BERs $\hat{P}_b$, total time of application of voltages or other forces and/or gradients employed to write data $T_t$, the average application time for multi-pulse methods $T_{avg}$, the average pulse time per bit $T^*_{avg}$ and the gain G are evaluated to facilitate comparison of the different data-writing methods. While $T^*_{avg}$ is the appropriate figure of merit to use when comparing energy consumption and memory bandwidth between different WRITE methods, $T_{avg}$ and $T_{max}$ are reflective of device wear and worst-case latency considerations.

As discussed above, one approach for ameliorating the potentially long WRITE-voltage application times needed to ensure high reliability for data storage in devices with memory elements that exhibit log-normal distribution of switching times is to use a feedback signal that allows a memory controller to determine, at selected points in time, whether a particular memory element has switched. It should be noted that this feedback-signal-based method for decreasing the average duration of application of WRITE voltages incurs significant costs in additional circuitry and circuit elements. Similarly, as discussed above, the ability to correct errors provided by the use of ECCs involves storing of additional, redundant bits that decreases the information rate for a memory device.

In the following discussion, various simplifications are made. For example, in the above-provided expression for $\hat{P}_b$, it is assumed that a decoder always fails when more than s bits of a codeword are corrupted or, in other words, the decoder is always able to detect uncorrectable error patterns. When the decoder detects an uncorrectable error pattern, the decoder discontinues attempting to decode the codeword, but does not introduce additional errors. In practice, this is not always the case. There is a small probability that the decoder will generate an incorrectly decoded codeword for an uncorrectable error pattern. The assumption is that this probability is ignored, which is reasonable in practice, since making the assumption does not significantly affect the result of the overall BER computation.

There are many different parameters that might be optimised for devices that feature memory elements with log-normally distributed switching times. For example, in addition to changing the length T and number of pulses during which a WRITE voltage, or other force or gradient, is applied, the voltage itself may be varied, with higher voltages generally decreasing the average pulse time needed to achieve a particular BER, but also increasing energy expended by a memory or other data-storage device to store information. It turns out, however, that, in many cases, there is no optimal WRITE voltage within the range of WRITE voltages that may be applied, but, instead, using larger-magnitude WRITE voltages generally results in expending less energy. In other words, the larger the WRITE voltage applied to a memory element, the shorter the WRITE voltage needs to be applied and the less total energy is expended to switch a memory element. Of course, at some point, increasing the WRITE voltage leads to failure of the device, and the longevity of the device may also be negatively impacted by use of high WRITE voltages. As another example, the variance σ of the natural fogs of switching times, modeled, as discussed above, by the above-provided PDF and CDF expressions, is dependent on the applied WRITE voltage. However, the dependence is weak, and thus does not constitute a good candidate parameter for optimization.

In the following discussion, as mentioned above, application times are reported in units of τ, or, in other words, the random variable is t/τ. Thus, in the following discussion, the results are provided in a time-scale-independent fashion. In the following computation of various parameters for various information-writing methods, a binary Bose, Ray-Chaudhuri, Hocquenghem ("BCH") ECC code C is used. This code is a [4304, 4096, 33] ECC, with R≈0.952, which can correct up to 16 random errors per 4096-bit code blocks. This particular code is used, in the following discussion, for good performance in correcting switching-failure errors, although in actual memory systems, additional considerations for selecting codes would also include the types of failure modes of the code and the ability of the code to adequately handle various types of correlated multi-bit errors. In the following analysis, two different target BER levels are considered: (1) $P_b=10^{-12}$, representing the lower end of BER levels for current storage devices and corresponding to storing of a two-hour high-definition movie without expected errors; and (2) $P_b=10^{-23}$, representative of future desired BER levels.

FIGS. 7A-F illustrate six different data-writing methods for writing data to a memory device that includes memory elements characterized by log-normally distributed switching times. These methods constitute hypothetical experiments in which various parameters for six different data-writing methods are determined by first writing the data to a memory and then reading the data back from memory. As discussed subsequently, parameters can be estimated for these hypothetical experiments based on the log-normal-distribution PDF and CDF along with other assumptions and considerations.

In a first method, shown in FIG. 7A, referred to as a "one-pulse-uncoded WRITE method," data is written to the memory using a single pulse of length T, in step 702, read back from the memory in step 703, and the data read back from the memory is compared to the data initially written to the memory in order to determine the BER for the one-pulse-uncoded WRITE method, in step 704. Of course, the experiment would be repeated many times, or many memory elements would be tested, or both in order to achieve statistically meaningful results. The one-pulse-uncoded method represents a reference point to which additional methods, which employ one or more of ECCs and feedback signals, are compared, below. In a one-pulse-coded method, shown in FIG. 7B, data is first encoded into codewords, in step 706 and then written to memory using a single WRITE pulse of length T in step 707. In step 708, the data is read back from memory and decoded, in step 709, following which the decoded data is compared to the data originally stored into memory to obtain the BER for the one-pulse-coded method in step 710. In the multi-pulse, uncoded method, shown in FIG. 7C, the data is written in multiple pulses. In the for-loop of steps 712-716, a sequence of pulses is used to attempt to write data to the memory. In each iteration of the for-loop, data is attempted to be written using a next pulse of length $T_i$, where i is an iteration variable indicating the number or index of the current iteration. Then, in step 714, the feedback signal provided from feedback-enabled memory elements is considered to determine whether or not the data has been correctly written to memory. Alternatively, the memory element may be read to verity that switching has occurred. When the data has not been correctly written to memory and when the current iteration index i is less than the iteration-termination value num, as determined in step 715, then a next iteration of the for-loop is carried out. Otherwise, the data is read back from memory, in step 717, and compared to the data written to memory in order to determine the BER from the multi-phase, uncoded method. The sum of the pulse times $T_0+\ldots+T_i$ is, as discussed above, equal to the total pulse time $T_t$ which is, in turn, less than or equal to a specified maximum voltage application duration $T_{max}$. For purposes of modeling this and related methods, it is assumed that the probability of switching is related to the total accumulated time of voltage application over the one or more pulses applied to memory elements in a WRITE operation. In other words, application of a WRITE voltage in three, one-second pulses is equivalent to applying the WRITE voltage for a single three-second pulse. The multi-pulse coded method, shown in FIG. 7D, is similar to the multi-pulse uncoded method, discussed above with reference to FIG. 7C, with the exception that the data is first encoded, using an ECC, in step 720, and subsequently decoded, in step 722.

FIG. 7E shows a continuous uncoded method. The continuous uncoded method is equivalent to the limit of the multi-pulse, uncoded method where the pulse times $T_i$ are shortened to infinitesimal periods that together add up to a maximum voltage-application time $T_{max}$. In step 724, a WRITE voltage is applied to the memory device to begin writing data to memory elements within the device. Then, in the while-loop of steps 725-726, the feedback signal from the memory elements is continuously monitored to determine when the memory elements intended to be switched by application of a WRITE voltage have, in fact, switched to their desired states. When that happens, the while-loop is terminated, the data is read back from memory in step 727, and the data is compared to the originally written data to determine the BER for the continuous uncoded method in step 728. The continuous coded method, shown in FIG. 7F, is similar to the continuous uncoded method, with the exception that the data is first encoded using an ECC, in step 730, and subsequently decoded, in step 732, alter being read from memory.

All of the methods illustrated in FIGS. 7A-F represent hypothetical data-storage methods that employ, in the case of the one-pulse-uncoded method, neither feedback nor ECC, or that employ one or both of feedback and ECC. Feedback is employed in the multi-pulse uncoded and multi-pulse coded methods as well as in the continuous uncoded and continuous coded methods. ECCs are employed in the one-pulse-coded, multi-pulse-coded, and continuous-coded methods. For the one-pulse methods, $T_{avg}=T_{max}=T$. For the one-pulse-coded method, $T^*_{avg}=T_{avg}/R$. For the one-pulse uncoded method, $T^*_{avg}=T_{avg}$.

Analysis of the Various WRITE Methods

In this section, the approaches to analyzing the various WRITE methods, discussed with reference to FIGS. 7A-F, are discussed. The analysis provides estimates of the various parameters, including $T_{avg}$, $T^*_{avg}$, and G, discussed above. The results of the various analyses are discussed in a following subsection.

In the one-pulse methods, the choice of T determines the input BER, $P_b(T)$, of the stored data, which, in the coded method, is assumed to have been encoded with C. The output BER of the coded method is then estimated by using the parameters n=4304, s=16, of the above-described BCH code.

A multi-pulse WRITE method using two pulses is the simplest data-writing method with feedback. An initial pulse of duration $T_1$ is applied, and the state of the device is sensed. When the device is found to have switched to the desired target state, the WRITE operation is deemed complete. When the device has not switched, an additional pulse of duration $T_{max}-T_1$ is applied, where $T_{max}>T_1$. Notice that, although interrupting the operation at time $T_1$ reduces the average total pulse time, the switching failure probability is still determined by $T_{max}$, as a result of which $P_b=1-F_{\tau,\sigma}(T_{max})$. The expected total pulse duration is $$T_{avg}(T_{max},T_1)=F_{\tau,\sigma}(T_1)T_1+(1-F_{\tau,\sigma}(T_1))T_{max},$$

Figure 8:
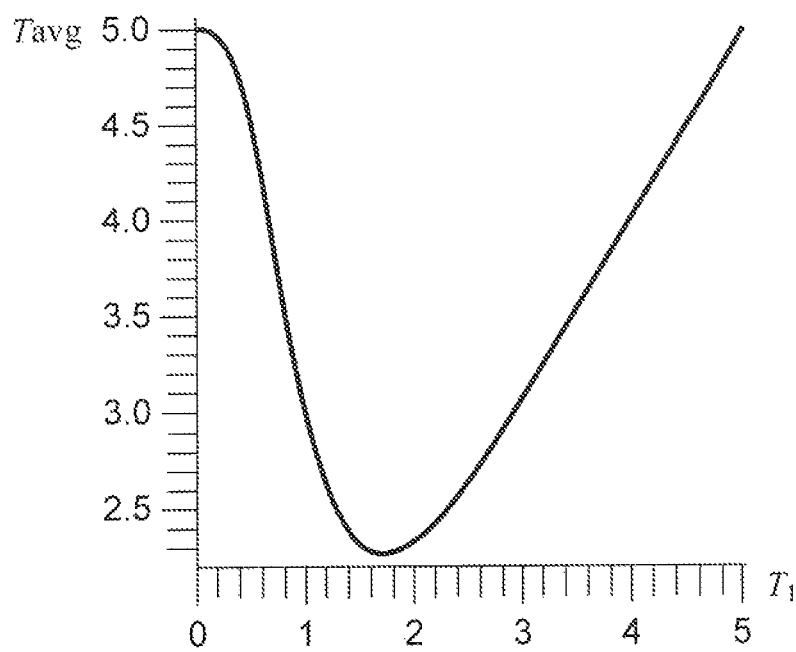
FIG. 8 illustrates the dependence of the total expected time of application of a WRITE voltage, $T_{avg}$, on the length of the first pulse, $T_1$, in a two-pulse WRITE method.

Given a target value of $P_b$, the value of $T_1$ that minimizes $T_{avg}$ can be computed. Indeed, it is readily verified that $T_{avg}(T_{max}, 0)=T_{avg}(T_{max},T_{max})=T_{max}$, and that, as a function of $T_1$, $T_{avg}$ has a sharp minimum in the interval $(0,T_{max})$. FIG. 8 illustrates the dependence of the total expected time of application of a WRITE voltage, $T_{avg}$, on the length of the first pulse, $T_1$, in a two-pulse WRITE method. To find the value of $T_1$ minimizing $T_{avg}$, the right-hand side of the above expression is differentiated, after substituting the full expression for $F_{\tau,\sigma}$, provided above, and solved numerically for the zero of the derivative, which is denoted by $T_1^{opt}(T_{max})$. The optimal expected total pulse length is then given by $T_{avg}(T_{max},T_1^{opt}(T_{max}))$.

For a binary symmetric noisy channel, the 2-pulse method is identical to the 1-pulse method, except that, in expectation, far shorter pulses and, correspondingly, far less energy, are used to obtain the same BER. The worst-case pulse durations are the same as in the 1-pulse case. Also as in the 1-pulse case, using ECC results in further decreases in expected pulse lengths and energy consumption, but, additionally, in large reductions in worst-case to average pulse-length ratios.

Three-pulse WRITE methods are analyzed in similar fashion to the two-pulse WRITE methods, except that sensing of the state of the memory element is allowed at discrete times $T_1$ and $T_2$, $0 \le T_1 \le T_2 \le T_{max}$. The expected total pulse length is given by the formula:

$$T_{avg}(T_{max},T_1,T_2)=F_{\tau,\sigma}(T_1)T_1+(F_{\tau,\sigma}(T_2)-F_{\tau,\sigma}(T_1))T_2+(1-F_{\tau,\sigma}(T_2))T_{max}.$$

For a given value of $T_{max}$ corresponding to a target value of $P_b$, $T_{avg}$ exhibits a deep global minimum in $T_1$ and $T_2$, which is easily found by taking partial derivatives with respect to $T_1$ and $T_2$ and solving the resulting system of equations by means of numerical methods.

In continuous-feedback WRITE methods, a pulse of maximal duration $T_{max}$ used while the state of the device is continuously monitored, with the applied voltage turned off immediately after switching occurs. The expected pulse length for for a continuous-feedback WRITE method is given by $$T_{avg}(T_{max}) = \int_{t=0}^{T_{max}} t f_{\tau,\sigma}(t) dt + (1 - F_{\tau,\sigma}(T_{max}))T_{max}$$

$$= \frac{1}{2}\tau e^{\frac{1}{2}\sigma^2} \text{erfc}\left(\frac{-\ln(T_{max}/\tau)+\sigma^2}{\sqrt{2}\,\sigma}\right) + \left(1 - \frac{1}{2}\text{erfc}\left(-\frac{\ln(T_{max}/\tau)}{\sqrt{2}\,\sigma}\right)\right)T_{max}.$$

Figure 9:
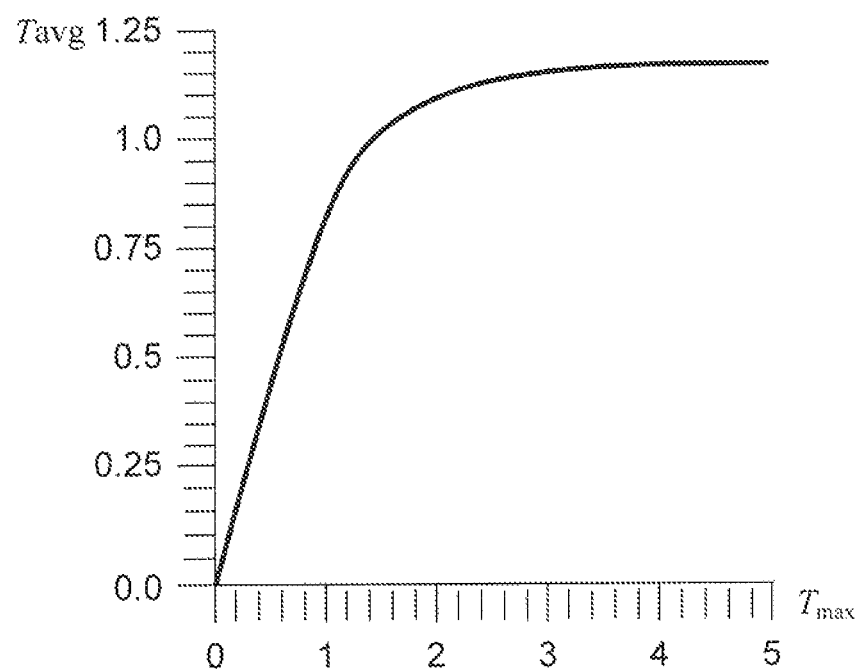
FIG. 9 illustrates the dependence of the expected cumulative time of application of a WRITE voltage, $T_{avg}$, on the maximum application time $T_{max}$ for a continuous WRITE method.

When $T_{max}$ tends to infinity, the above expression tends, as expected, to $$\bar{T}(\tau, \sigma) = \tau e^{\frac{1}{2}\sigma^2},$$

the mean of mean of the log-normal density $f_{\tau,\sigma}$. In fact this limit is approached rather rapidly when $T_{max}/\tau \gg 1$. FIG. 9 illustrates the dependence of the expected cumulative time of application of a WRITE voltage, $T_{avg}$, on the maximum application time $T_{max}$ for a continuous WRITE method.

Feedback offers significant gains in the expected duration of WRITE operations. These gains translate directly to reduced expected energy consumption and reduced wear on the devices. The use of EEC further enhances these gains, sometimes by significant margins. Additionally, the very significant reductions in $T_{max}$ due to coding lead to corresponding gains in system throughput, even when WRITE requests are restricted to occur at least $T_{max}$ units of time apart. To let throughput benefit also from the reduction in $T_{avg}$, and increase operation rate beyond the $T_{max}$ limitation, a queueing or buffering mechanism for write operations may be implemented, as some operations will take time $T_{max}$, and WRITE requests arriving at a higher rate will have to be queued and wait while these operations complete. The buffering requirements and reliability of such a system can be analyzed using the tools of queueing theory.

Consider a 2-pulse method, with parameters $T_1$, $T_{max}$, and $T_{avg}$. Assume, for simplicity, that WRITE requests arrive at a fixed rate, with an inter-arrival period of A units of time. If $A \geq T_{max}$, no queueing is needed, so it is assumed that $A < T_{max}$. Clearly, $A > T_1$ for the queue to have any chance of remaking bounded (in fact, from well-known results in queueing theory, and as will also transpire from the analysis below, $A > T_{avg}$. A further simplifying assumption is that the ratio $d = (T_{max} - A)/(A - T_1)$ is an integer. Because the ratios $T_{max}/T_{avg}$ are rather large, this is not a very restrictive assumption given a target BER achieved with a certain value of $T_{max}$. In most cases, $T_{max}$ can be slightly increased to make d an integer. With these assumptions, the analysis of the waiting time in the queue reduces to studying the simple integer-valued random walk.

Let $w_i$ denote an integer random variable representing the waiting time in the queue of the $i^{th}$ WRITE request (the actual waiting time being $(A - T_1)w_i$), and let $p = P(t_i = T_1)$, where $t_i$ is the actual total pulse length of the $i^{th}$ WRITE, the service time for the $i^{th}$ WRITE request. Let $(a-b)^*$ denote $a-b$ when $a > b$, or 0 otherwise. Then, taking $w_0 = 0$ as the initial condition $$w_{i+1} = (w_i - D_i)^*, i \geq 1,$$

where $D_i$ is a random variable assuming values in $\{1, -d\}$, with $P(D_i = 1) = p$, and $P(D_i = -d) = 1 - p$. By previous assumptions, these probabilities are independent of i. The random walk $w_i$ is a Markov chain which, for sufficiently large p, is persistent, returning infinitely often to the state $w_i = 0$. Under this assumption, the chain has a stationary distribution $$P_w = \lim_{i \to \infty} P(w_i = w).$$

Clearly, a state $w_{i+1} = w$ in the range $1 \leq w \leq d-1$ can be reached from $w_i = w + 1$, through $D_i = 1$. Therefore $$P_w = pP_{w+1} = p^2 P_{w+2} = \ldots = p^{d-w} P_d = p^{d-w} u, 1 \leq w \leq d,$$

where $u = P_d$. State $w = 0$, on the other hand, can be reached from either $w = 0$ or $w = 1$, again with $D_i = 1$. Thus, $P_0 = pP_0 + pP_0 + p^d u$. Solving for $P_0$ $$P_0 = \frac{p^d}{1 - p} u.$$

Finally, for $w \geq d$, state w can be reached from $w + 1$ with $D_i = 1$, or from $w - d$ with $D_i = -d$, yielding the recursion $$P_w = (1-p)P_{w-d} + pP_{w+1}, w \geq d.$$

An explicit expression for the generating function can be obtained from the above expressions as $$G(z) = \sum_{w=0}^{\infty} P_w z^w,$$

from which, in turn, the expectation of the waiting time can be derived $$E[w] = \frac{(1-p)(1+d)d}{2(1 - (1-p)(1+d))}.$$

Letting $W = (A - T_1)w$, and translating back to time units $$E[W] = \frac{(T_{avg} - T_1)(T_{max} - A)}{2(A - T_{avg})}, \quad T_{avg} < A \leq T_{max}.$$

As expected, $E[W]$ approaches zero when A approaches $T_{max}$ (no queue is needed when $A \geq T_{max}$), and $E[W]$ approaches infinity when A approaches $T_{avg}$. By Little's theorem [3], the expectation of the queue size, Q, is given by $$E[Q] = E[W]/A.$$

It is clear from above-provided expressions that the variable u multiplies all the probabilities $P_u$. Consider $$G(z) = uG_0(z)z^i + uz^d G_1(z),$$

where $$G_0(z) = u^{-1} \sum_{w=0}^{d-1} P_w z^w$$

and $$G_1(z) = u^{-1} \sum_{w=d}^{\infty} P_w z^{w-d}.$$

An explicit expression for $G_0(z)$ follows directly, yielding $$G_0(z) = \frac{p^d}{1-p} + pz \frac{p^{d-1} - z^{d-1}}{p - z}.$$

As for $G_1(z)$, applying the expression for $G_1(z)$ and the above-provided recursion, and recalling that $u = P_d$, the following expression is obtained $$uG_1(z) = \sum_{w=d}^{\infty} P_w z^{w-d}$$
$$= (1-p) \sum_{w=d}^{\infty} P_{w-d} z^{w-d} + p \sum_{w=d}^{\infty} P_{w+1} z^{w-d}$$
$$= (1-p)G(z) + upz^{-1}(G_1(z) - 1)$$
$$= u(1-p)(G_0(z) + z^d G_1(z)) + upz^{-1}(G_1(z) - 1).$$

Rearranging terms, and after some algebraic manipulations, the following expressions are obtained $$G_1(z) = \frac{p - (1-p)zG_0(z)}{(1-z) - (1-p)(1-z^{d+1})}$$
$$= \frac{p - \frac{pz}{p-z}(g_d(z)(1-p) - (1-p^d))}{1 - (1-p)g_{d+1}(z)}.$$

where $g_h(z) = (1-z^h)/(1-z)$ for integers $h \geq 1$ eliminates a common factor $(1-z)$ from the numerator and denominator of the expression, for $G_1(z)$. The above expressions determine $G(z)$ up to a factor of u. Setting $G(1)=1$, the following expression is obtained $$u=(1-p)((d+1)p-d)p^{-(d+1)},$$

which completes the determination of $G(z)$. The expectation of w is given by $$E[w] = \frac{dG(z)}{dz}\bigg|_{z=1},$$

which yields the first-provided expression for $E[w]$. The second expression for $E[W]$, provided above, then follows by substituting $d=(T_{max}-A)/(A-T_1)$ into the first-provided expression, multiplying by the time scale $A-T_1$, and recalling that $T_{avg}=pT_1+(1-p)T_{max}$. Notice that, for u to be positive, $p>d(d+1)$, leading to $A>T_{avg}$.

Again consider discrete pulsing WRITE methods with intervening reads to verify switching, but rather than imposing an explicit limit on the number of pulses, consider instead imposing a penalty on the verification/read operation and determine the optimal pulsing method subject to this penalty.

Let $T_1<T_2<\ldots<T_{n-1}<T_{max}$ denote a sequence of pulse ending times which also coincide with reads, except for the final pulse ending at $T_{max}$ where there is no follow-up read. Thus, the first pulse is of duration $T_1$, the second pulse of duration $T_2-T_1$, and so forth. Assume that $T_{max}$ is determined, as above, via $T_{max}=p_b^{-1}(p)$ for some desired raw bit-error rate $p_b=p$. Further assume that a READ operation takes time $t_r$. Therefore, the total expected time penalty for pulsing and reading can be expressed as $$T_{avg}(T_{max}, n, T_1, \ldots, T_{n-1}) =$$
$$Pr(T_{sw} > T_{n-1})[T_{max} + (n-1)t_r] + \sum_{i=1}^{n-1} Pr(T_{i-1} < T_{sw} \leq T_i)[T_i + it_r]$$

where $T_0=0$ and $T_{sw}$ is the random amount of aggregate pulse duration used to switch. Consider $$T^* = \min_{n, 0 < T_1 < \ldots < T_{n-1} < T_{max}} T_{avg}(T_{max}, n, T_1, \ldots, T_{n-1})$$

the minimum average pulse and verification time over all possible pulse end times and number of pulses.

The $T_i$ are constrained to be some positive integer multiple of a small time interval $t=T_{max}/m_{max}$, as in $T_i=m_i t$, and optimized over the $m_i$. The maximum number of pulses is then $T_{max}/t=m_{max}$. Let $\hat{T}^*$ denote the resulting optimum $T_{avg}$ under this constraint on the pulse ending times. Clearly, $\hat{T}^* \geq T^*$, and it can be shown that $$\hat{T}^* \leq T^* + t.$$

Given an unconstrained set of pulse end times $T_1, \ldots T_{n-1}$, let $T=\{\lceil T_i/t \rceil t : i \in (1, \ldots, n-1)\}$ be the set of quantized end times and $\hat{T}_1 < \ldots < \hat{T}_{\hat{n}-1}$ be the elements of $T$ smaller than $T_{max}$. This construction implies that $$\hat{n} \leq n$$

$$T_i > \hat{T}_j \text{ implies } i \leq j$$

Comparing $T_{avg}(T_{max}, n, T_1, \ldots, T_{n-1})$ and $T_{avg}(T_{max}, \hat{n}, \hat{T}_1, \ldots, \hat{T}_{\hat{n}-1})$. $T_{avg}(T_{max}, n, T_1, \ldots, T_{n-1})$ can be interpreted as the expectation of random variable $f(T_{sw})$ where $f(x)$ is $$f(x) = 1(x > T_{n-1})[T_{max} + (n-1)t_r] + \sum_{i=1}^{n-1} 1(T_{i-1} < x \leq T_i)[T_i + it_r]$$

and similarly interpret $T_{avg}(T_{max}, \hat{n}, \hat{T}_1, \ldots, \hat{T}_{\hat{n}-1})$ as the expectation of the random variable $g(T_{sw})$ with $g(x)$ as $$g(x) = 1(x > \hat{T}_{\hat{n}-1})[T_{max} + (\hat{n}-1)t_r] + \sum_{i=1}^{\hat{n}-1} 1(\hat{T}_{i-1} < x \leq \hat{T}_i)[\hat{T}_i + it_r]$$

For any $0 \leq x \leq T_{max}$, $g(x) \leq f(x) + t$, which, by way of the expectation interpretation, suffices to establish $\hat{T}^* \leq T^* + t$. Suppose $\hat{T}_{j-1} < x \leq \hat{T}_j < T_{max}$, then $g(x) = \hat{T}_j + jt_r$. There, will be some i such that $T_{i-1} < x \leq T_i$, where $\hat{T}_0 = T_0 = 0$ and $\hat{T}_{\hat{n}} = T_n = T_{max}$. Thus $T_i \geq x > \hat{T}_{j-1}$, and it then follows from $T_i > \hat{T}_j$ implies $i > j$ that $i > j-1$ or $i \geq j$. Additionally, it is be the case that $T_i > \hat{T}_j - t$, since otherwise $\lceil T_i/t \rceil t$ would not be in the set of quantized end times T defined above. Putting these two facts together $$f(x) = T_i + it_r > \hat{T}_j - t + jt_r$$
$$= g(x) - t$$

establishing that indeed $g(x) < f(x) + t$, for $x \leq \hat{T}_{\hat{n}-1}$. Nearly the same argument can be applied for $x > \hat{T}_{\hat{n}-1}$.

Thus, a goal is to compute $$\hat{T}^* = \min_{n, 0 < m_1 < \ldots < m_{n-1} < m_{max}} T_{avg}(T_{max}, n, m_1 t, \ldots, m_{n-1} t).$$

The standard approach to such a computation is dynamic programming. For any $0 \leq m \leq m_{max}$ and $m = m_0 < m_1 < \ldots < m_{n-1} < m_{max}$, define $$T_{avg}(m, n, m_1, \ldots, m_{n-1}) = \frac{Pr(T_{sw} > m_{n-1}t)}{Pr(T_{sw} > tm)}[T_{max} - tm + (n-1)t_r] +$$
$$\sum_{i=1}^{n-1} \frac{Pr(m_{i-1}t < T_{sw} \leq m_i t)}{Pr(T_{sw} > tm)}[(m_i - m)t + it_r]$$

which corresponds to the average remaining write time assuming a new pulse starts at mt, with subsequent pulse ending times $\{m_i t\}$, and assuming no switch occurred prior to time mt. Then define $$\hat{T}^*(m) = \min_{n, m < m_1, \ldots, m_{n-1} < m_{max}} T_{avg}(m, n, m_1, \ldots, m_{n-1}),$$

as the best choice of pulse ending times subsequent to pulse time mt, assuming a pulse starts at mt.

Clearly $\hat{T}^* = \hat{T}^*(0)$. Dynamic programming involves computing $\hat{T}^*(m)$ recursively, based on $\hat{T}^*(m')$ for $m' > m$. Note that for $m = m_{max} - 1$ there is precisely one possible pulse end time, namely the one ending at $m_{max} t$, so that $$\hat{T}^*(m_{max}-1) = t.$$

For $m < m_{max} - 1$, one can use a single pulse ending at $m_{max} t$, in which case $$T_{avg}(m, 1) = (m_{max} - m)t,$$

or one can use n≥2 pulses ending at intermediate times. For this case, it turns out that $$\min_{n\geq 2, m<m_1<\ldots<m_{n-1}<m_{max}} T_{avg}(m, n, m_1, \ldots, m_{n-1}) =$$

$$\min_{m<m_1<m_{max}} m_1 t - mt + t_r + \frac{Pr(T_{sw} > m_1 t)}{Pr(T_{sw} > mt)} T^*(m_1).$$

This is shown as follows $$\min_{n\geq 2, m<m_1<\ldots<m_{n-1}<m_{max}} T_{avg}(m, n, m_1, \ldots, m_{n-1}) =$$

$$\min_{m<m_1<m_{max}} \min_{\substack{n\geq 2, m_2<\ldots<m_{max} \\ m_2>m_1}} T_{avg}(m, m_1, \ldots, m_{n-1}) =$$

$$\min_{m<m_1<m_{max}} \min_{\substack{n\geq 2, m_2<\ldots<m_{max} \\ m_2>m_1}} \frac{Pr(T_{sw} > m_1 t)}{Pr(T_{sw} > mt)} [T_{max} - mt + (n-1)t_r] +$$

$$\sum_{i=1}^{n-1} \frac{Pr(m_{i-1} < T_{sw} \leq m_i t)}{Pr(T_{sw} > mt)} [(m_i - m)t + it_r] =$$

$$\min_{m<m_1<m_{max}} \min_{\substack{n\geq 2, m_2<\ldots<m_{max} \\ m_2>m_1}} m_1 t - mt + t_r +$$

$$\frac{Pr(T_{sw} > m_{n-1}t)}{Pr(T_{sw} > mt)} [T_{max} - m_1 t + (n-2)t_r] +$$

$$\sum_{i=2}^{n-1} \frac{Pr(m_{i-1}t < T_{sw} \leq m_i t)}{Pr(T_{sw} > mt)} [(m_i - m_1)t + (i-1)t_r] =$$

$$\min_{m<m_1<m_{max}} m_1 t - mt + t_r + \min_{\substack{n\geq 2, m_2<\ldots<m_{max} \\ m_2>m_1}} \frac{Pr(T_{sw} > m_1 t)}{Pr(T_{sw} > mt)}$$

$$\left( \frac{Pr(T_{sw} > m_{n-1}t)}{Pr(T_{sw} > m_1 t)} [T_{max} - m_1 t + (n-2)t_r] + \right.$$

$$\left. \sum_{i=2}^{n-1} \frac{Pr(m_{i-1}t < T_{sw} \leq m_i t)}{Pr(T_{sw} > mt)} [(m_i - m_1)t + (i-1)t_r] \right) =$$

$$\min_{m<m_1<m_{max}} m_1 t - mt + t_r + \frac{Pr(T_{sw} > m_1 t)}{Pr(T_{sw} > mt)} T^*(m_1).$$

Combining $T_{avg}(m,1)=(m_{max}-m)t$ and the initially provided expressions for $$\min_{n\geq 2, m<m_1<\ldots<m_{n-1}<m_{max}} T_{avg}(m, n, m_1, \ldots, m_{n-1})$$

gives $$T^*(m) =$$

$$\min\left\{(m_{max} - m)t, \min_{m<m_1<m_{max}} m_1 t - mt + t_r + \frac{Pr(T_{sw} > m_1 t)}{Pr(T_{sw} > mt)} T^*(m_1)\right\}.$$

Thus, one can compute $\hat{T}^*(m)$ from $\hat{T}^*(m')$ for m'>m all the way down to m=0. The optimizing pulse end times can be round by keeping track of the optimizing $m_1$ for each m, where the optimizing $m_1$ can be taken to be $m_{max}$ if the outer minimum is achieved by the first term, corresponding to one pulse ending at $T_{max}$.

The complexity of the algorithm is readily seen to be no worse than $O(m^2_{max})$ operations. A simple way to dramatically speed up the computation of the minimization over $m_1$, relative to a full search, is to compute the running minimum for each successively larger value of $m_1$, starting with $m_1=m+1$, and abort the search when $m_1$ such that $m_1 t-mt+t_r$ exceeds the running minimum. Since $m_1 t-mt+t_r$ is increasing in $m_1$ and since the other component of the cost is always non-negative, aborting in this manner preserves optimally.

Results of the Analysis of the Various WRITE Methods

FIG. 10 provides a table showing comparisons of a number of different WRITE methods for writing data into a memory that includes memory elements characterized by log-normally distributed switching times. The table is horizontally divided into two horizontal sections 1002 and 1004, with horizontal section 1002 showing calculated characteristics for various WRITE methods in which the reading cost for methods that incorporate monitoring of feedback signals from memory elements is not considered and with horizontal section 1004 showing calculated characteristics for multi-pulse WRITE methods in which the reading costs are estimated and included in the calculations of the characteristics of the various WRITE methods. The table shown in FIG. 10 is vertically divided into two vertical sections, including a first vertical section 1006 in which the characteristics are calculated to ensure a switching-failure probability $P_b=10^{-12}$ and a second vertical section 1008 in which the characteristics are calculated to ensure a switching-failure probability $P_b=10^{-23}$. In each vertical section of each horizontal section, or, in other words, each quadrant of the table, $$T^*_{avg}, T_{avg}, T_{max}, \frac{T_{max}}{T_{avg}},$$

and gain are shown for each of the considered WRITE methods, with $T^*_{avg}$ explicitly shown for coded methods. The second horizontal section 1004, shows the characteristics obtained for multi-pulse WRITE methods with a specified $T_{max}$ and with the cost for reads between pulses equal to various fractions of τ.

As can be seen by analysis of the data shown in the table provided in FIG. 10, the gain G for coded WRITE methods is generally greater than for encoded WRITE methods and the average or expected pulse time $T_{avg}$ is generally less for coded methods than uncoded methods. The $T_{max}$ voltage-application time for coded methods is significantly less than $T_{max}$ for uncoded methods, in all cases. The decrease in $T_{max}$ for coded methods versus uncoded methods occurs even when the reading costs are considered in the calculations. Furthermore, the gains for multi-pulse methods which employ feedback are significantly greater than for the one-pulse coded method.

Figure 11:
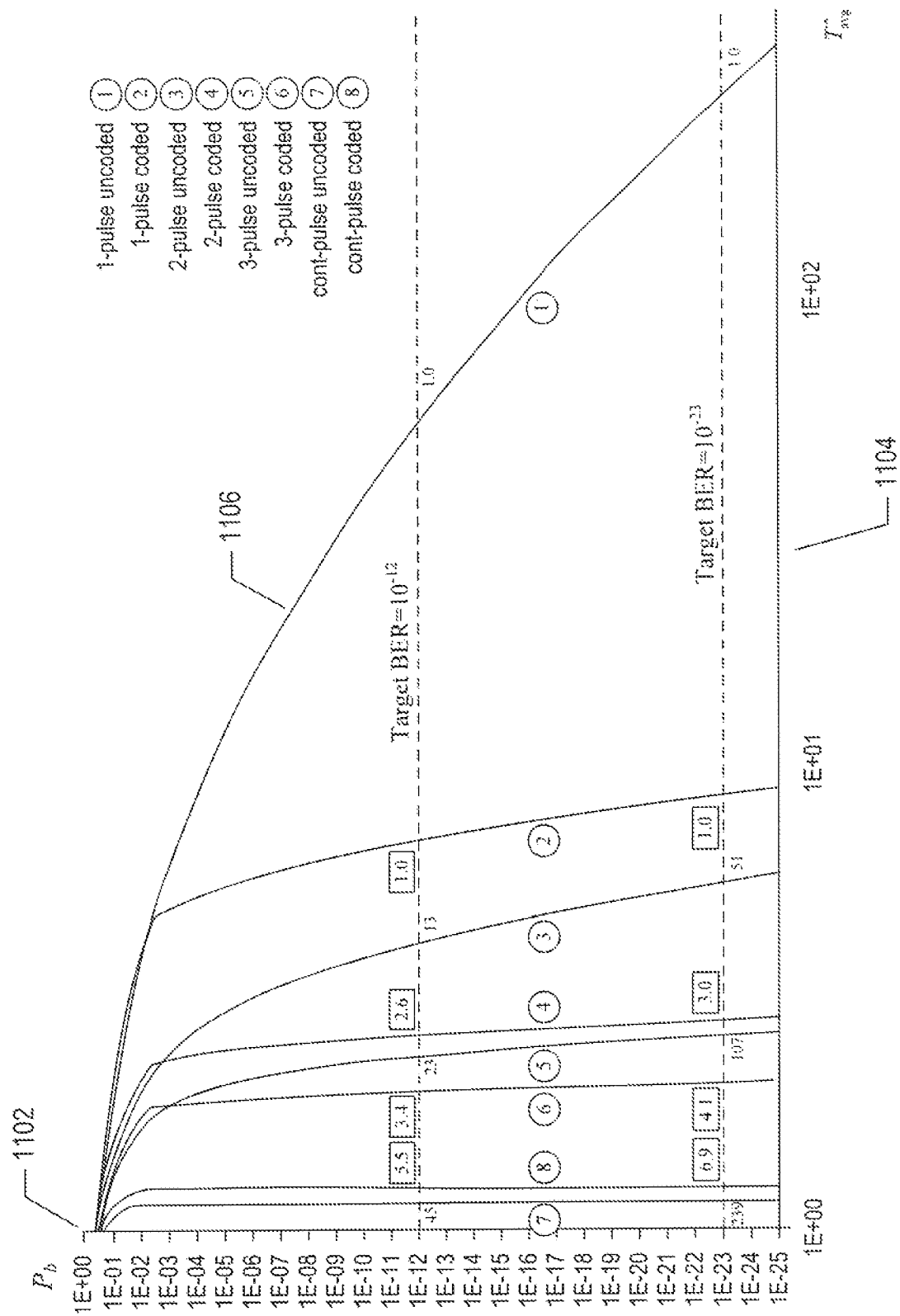
FIG. 11 graphically illustrates data from the first horizontal section of the table provided in FIG. 10.

FIG. 11 graphically illustrates data from the first horizontal section of the table provided in FIG. 10. In FIG. 11, the switching-failure probability is plotted with respect to the vertical axis 1102 and the expected pulse time per bit, $T^*_{avg}$ is plotted with respect to the horizontal axis 1104. Each curve, such as curve 1106, illustrates the functional relationship between switching failure probability and $T^*_{avg}$ for each of eight different WRITE methods. $T^*_{avg}$ is seen to significantly decrease with increase in the number of pulses employed and the $T^*_{avg}$ value for coded methods is generally less than for uncoded methods.

At $P_b=10^{-23}$, the coded 2-pulse method offers 3 dB of additional gain over the uncoded 2-pulse method and, more notably, coding reduces the worst-case-to-average ratio from about 50:1 to 3:1. In fact, the 2-pulse encoded method has a gain of just 1.8 dB over the 1-pulse coded one. When comparing the 3-pulse uncoded and coded methods, coding offers additional gains in expected total pulse length (1 dB at $P_b=10^{-23}$) and large improvements in worst-case to average ratios. In fact, as shown in FIG. 11, the 3-pulse uncoded curve is very close to the 2-pulse coded curve for the ranges of $P_b$ of interest, with the 3-pulse uncoded method incurring a 107:1 worst-case-to-average ratio at $P_b=10^{-23}$ versus a 3:1 ratio for the 2-pulse coded method. For the continuous WRITE methods, the effect of the fast convergence to the mean of the log-normal density $f_{\tau,\sigma}$ can be seen in FIG. 11, where the curves for the continuous WRITE methods are seen to fall practically with vertical slope, at $T^*_{avg}=T$ in the encoded case ($T\approx1.173\tau$ for the parameter $\sigma_1$ used in the examples), and $T^*_{avg}=T/R\approx1.05T$ for the coded method. Consequently, the average pulse length is practically independent of the target BER, and the difference in coding gain between the uncoded and coded methods in this case is $-10\log_{10}R\approx0.2$ dB in favor of the uncoded. Still, the coded method offers, again, a large improvement in worst-case-to-average ratio: from 239:1 in the encoded case to 6.9:1 in the coded one, at $P_b=10^{-23}$.

Using continuous feedback offers an additional coding gain of approximately 2.3 dB over the 3-pulse coded method (a ratio of 1.7:1 in average pulse length). In principle, this gap could be narrowed in a discrete pulse setting by arbitrarily increasing the number of pulses. In fact, the continuous pulse case can be seen as the limit of the discrete pulse case as the number of pulses lends to infinity.

To summarize, the effects and interactions of two mechanisms aimed at addressing the challenges posed by the log-normal switching behavior of certain memristor devices have been analyzed. In various settings, the use of coding significantly improves the overall performance of the system, by reducing average and worst-case switching times. These improvements translate into savings in energy consumption and device wear, as well as significant increases in writing throughput. With a judicious combination of a feedback mechanism and error-correction coding, the log-normal switching behavior of memristors should not be an obstacle to meeting the reliability requirements of modern storage systems.

FIG. 12 provides a table that lists the maximum number of pulses and average number of pulses for multi-pulse WRITE methods that achieve desired switching-failure probabilities for considered READ times that are various different fractions of $\tau$. As can be seen in the table provided in FIG. 12, the maximum number of pulses is significantly smaller for coded methods than uncoded methods.

Figure 13:
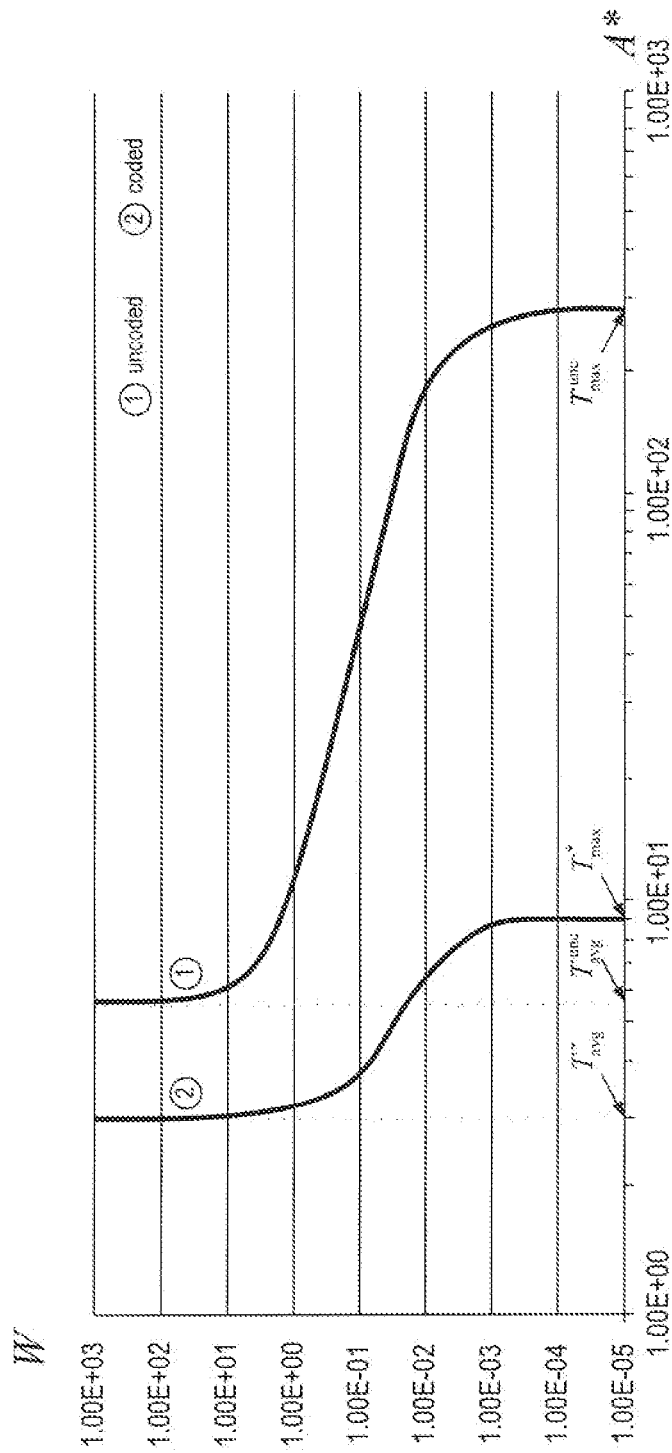
FIG. 13 shows a graph of expected wait times with respect to WRITE inter-arrival times for an uncoded, two-pulse write method and a coded two-pulse WRITE method.

FIG. 13 shows a graph of expected wait times with respect to WRITE inter-arrival times for an uncoded, two-pulse write method and a coded two-pulse WRITE method. As can be seen in FIG. 13, the expected wait times for the coded two-pulse WRITE method are significantly smaller than the expected wait times for uncoded two-pulse methods for all WRITE inter-arrival times. The coding overhead is incorporated into $A^*=A/R$ for the coded method, while $A^*=A$ for the uncoded method, which allows for a fair comparison between the two methods; the times $T_{max}$ and $T_{avg}$ are also similarly scaled. Information write throughput is proportional to $1/A^*$. The positive impact of coding on this throughput is evident in the figure, both without a queueing system ($A^*=T^*_{max}$) and with one ($T^*_{avg}<A^*<T^*_{max}$). When queueing is used, the expectation E[Q] provides guidance for the design of an appropriate buffer for WRITE requests.

Figure 14:
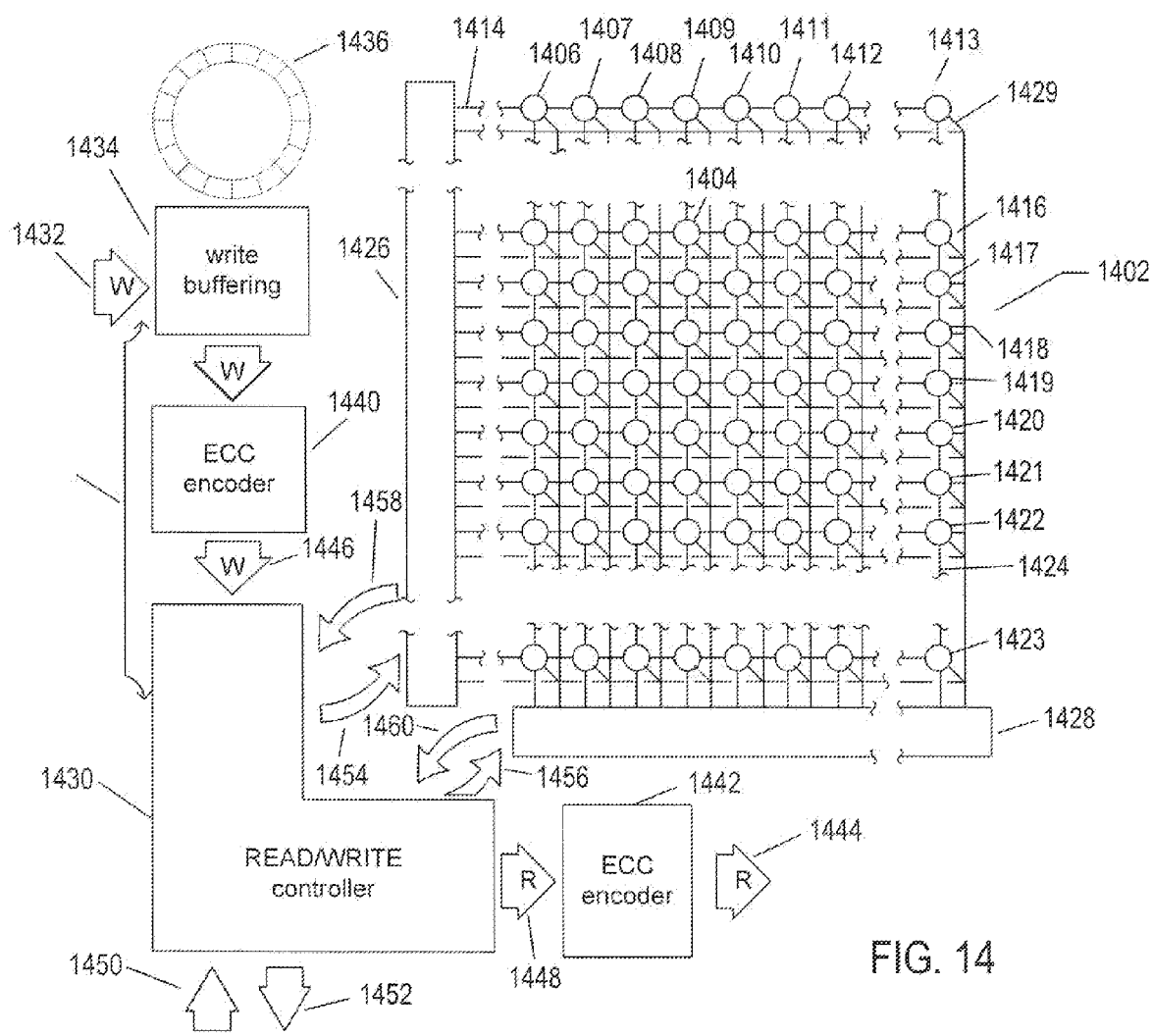
FIG. 14 illustrates a data-storage device that incorporates both feedback signals and ECC encoding.

Examples of Electronic Data-Storage Devices to which the Current Application is Directed FIG. 14 illustrates a data-storage device that, incorporates both feedback signals and ECC encoding. By using both feedback signals and by encoding data prior to writing, the maximum WRITE latency $T_{max}$ is significantly decreased with respect to the $T_{max}$ needed when ECC encoding is not employed, as discussed above, shown by data provided in FIG. 10 and illustrated in FIG. 11. The decrease in maximum WRITE latency and decrease in $T_{avg}$ leads to shorter average and maximum WRITE cycles for the data-storage device and correspondingly higher data-input bandwidth. The feedback signals allow application of a WRITE voltage or other force or gradient needed to switch particular memory elements within the memory to be terminated, or short circuited, as soon as switching is complete for all intended memory elements. Use of ECC encoding allows the maximum duration of WRITE-voltage application, or the duration of application of another force or gradient to switch memory elements, to be significantly decreased and yet still provide desired bit-error rates for the data-storage device. Shortening $T_{max}$ moves $T_{max}$ leftward, along the horizontal axis of the PDF, in FIG. 3A, leaving more area within the tail of the PDF past the $T_{max}$ that corresponds to the probability that switching does not occur during application of a WRITE voltage for a duration up to $T_{max}$. However, use of ECC encoding allows many of the switching errors to be subsequently corrected, following READ operations, effectively decreasing the tail area back to a level corresponding to the desired bit-error rate. As discussed below, use of both ECC encoding and monitoring of feedback, signals also allows a smaller buffer to be used for incoming WRITE requests, reducing the cost and complexity of the data-storage device.

The information-storage device, that represents one example, includes one or more two-dimensional arrays of memory elements 1402. In FIG. 14, each memory element is represented by a disk, such as disk 1404. The memory elements are arranged into rows and columns, and the memory elements within a row are interconnected by a horizontal electrode and the memory elements in each column are interconnected by a vertical electrode or signal line. For example, in FIG. 14, memory elements 1406-1413 are interconnected by horizontal signal line 1414. Memory elements 1413 and 1416-1423 are interconnected by horizontal signal line 1424. A first demultiplexer or other control element 1426 controls voltages applied to the horizontal signal lines and a second demultiplexer or other control element 1428 controls voltages applied to the vertical signal lines.

Each memory element also generates a feedback signal, as discussed above with reference to FIG. 5, which is output to both horizontal and vertical feedback signal lines. In FIG. 14, the feedback signals that are generated by memory elements are shown as a diagonal line segments, such as diagonal line segment 1420 emanating from memory element 1413. The first and second controllers 1426 and 1428 monitor these feedback signals, during WRITE operations, in order to generate WRITE-completion signals returned to the READ/WRITE controller. When a data-storage-unit address is supplied, by the READ/WRITE controller 1430, to the first and second control elements 1426 and 1428, along with a data-storage-unit's worth of data to be written to the data-storage device, the first and second controllers 1426 and 1428 apply appropriate voltages to particular signal lines in order to place the memory elements corresponding to the address data-storage unit into states corresponding to the bit values within the data to be written to the data-storage device. Data input to the information-storage device for writing 1432 is buffered by a WRITE-buffering component 1434 that buffers the input data in a circular buffer 1436. The WRITE-buffering component allows WRITE operations to be received by the information-storage device, during short burst intervals, at a faster rate than can be accommodated by the in formation-storage device over time. A burst of WRITEs may end up stored within the circular buffer and then, after the final WRITE operation of the burst is received, the WRITE operations are processed as quickly as possible by the READ/WRITE controller, eventually emptying the circular queue. The READ/WRITE controller receives WRITE-operation availability signals 1438 from the WRITE-buffering component allowing the READ/WRITE controller to cooperate with the WRITE-buffering component to dequeue WRITE operations from the circular queue and input them to the ECC encoder 1440. Data to be written to the device is supplied first to an ECC encoder 1440 which encodes the data, as discussed above, to a series of codewords which are then transmitted to the READ/WRITE controller 1430. The READ/WRITE controller not only controls the first and second controllers 1426 and 1428 to write data to the data-storage device, but also controls the first and second controllers 1426 and 1428 to read stored data from the data-storage device and transmit the read data to an ECC decoder 1442 which decodes the codewords read from the data-storage device and outputs encoded data 1444. The READ/WRITE controller 1430 receives data 1446 and outputs data 1448, receives control signals 1450 and outputs non-data information 1452, outputs data and control signals 1454 and 1456 to the first and second controllers 1426 and 1428, respectively, and receives data and control signals 1458 and 1460 from the first and second controllers 1426 and 1428, respectively.

In an alternative example, the ECC encoder occurs in the input sequence upstream from WRITE buffering, with encoded data queued for internal WRITE operations rather than, in the previously described example, uncoded data being queued. In yet alternative examples, the ECC encoder may be incorporated into the READ/WRITE controller or occur at additional positions within the input sequence prior to the first and second controllers.

In an alternative example, either the first and second controllers or the READ/WRITE controller iteratively WRITE data to memory elements using the above-described multi-pulse method, reading back the data to determine where or not the WRITE has succeeded. In this alternative example, the memory elements do not generate feedback signals. Instead, the first and second controllers 1426 and 1428 apply multiple WRITE pulses to memory elements, reading the contents of the memory elements to which the pulses are applied alter each pulse, in order to determine whether or not the data has been correctly written. Based on the multiple-pulse WRITE and intervening READ operations used to verity correct data storage, the first and second controllers generate WRITE-completion signals returned to the READ/WRITE controller, as in the first-described example in which the state or memory elements is continuously monitored.

Note that, in the following discussion, it is assumed that the WRITE operations contain up to some maximum amount of data that can be written, in an internal WRITE operation, by the first and second controllers to the one or more arrays of memory elements. Thus, the data associated with a WRITE operation is ECC encoded and then passed to the first and second controllers for writing to the one or more arrays of memory elements. The feedback signal provided by the one or more arrays of memory elements indicates whether or not the entire, internal WRITE has succeeded. The first and second controllers may apply WRITE voltages for different periods of time to individual memory elements, or may apply a different number of pulses to individual memory elements, during an internal WRITE operation. Alternatively, a more complex buffering mechanism may be used to store received WRITE operations associated with a greater amount of data than can be written in a single internal WRITE operation and to generate multiple internal WRITE operations for the received WRITE operations associated with large amounts of data. The first and second controllers, in general, control storage to multiple memory elements, in parallel, during an internal WRITE operation.

Figure 15:
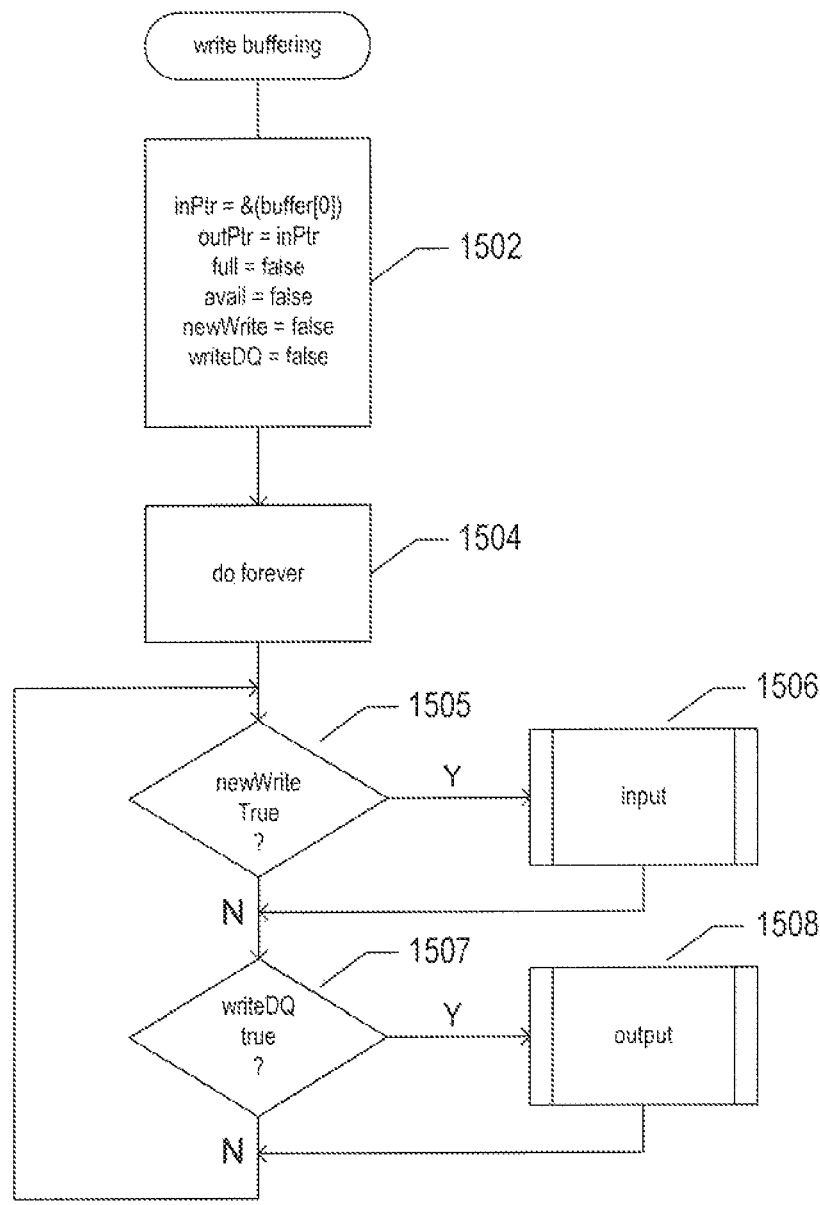
FIG. 15 shows a control-flow diagram for operation of the WRITE-buffering component (1434 in FIG. 14).

FIG. 15 shows a control-flow diagram for operation of the WRITE-buffering component (1434 in FIG. 14). In step 1502, a number of variables are initialized. The variable "inPtr" is set to point to, or contain the address of, a first data-storage unit within the circular buffer. The variable "outPtr" is set equal to the variable "inPtr." The variable "full" is set to FALSE. This variable corresponds to a signal sent by the WRITE-buffering component to the READ/WRITE controller to indicate when the circular buffer is nearly full. The variable "avail" is set to FALSE. This variable corresponds to a signal sent by the WRITE-buffering component to the READ/WRITE controller to indicate when WRITE operations are available for delivery to the READ/WRITE controller. The variable "newWrite" is set to FALSE and the variable "writeDQ" is also set to FALSE. The variable "newWrite" corresponds to a signal sent from an external device indicating that a WRITE operation is desired and the variable "writeDQ" corresponds to a signal sent by the READ/WRITE controller to the WRITE-buffering component to indicate that the READ/WRITE controller has read a next READ operation from the circular buffer.

Next, in a continuous loop of steps 1504-1508, the WRITE-buffering component determines whether any new WRITE operations have been requested by an external device, in step 1505, and processes these WRITE operations by calling the routine "input" in step 1506. The WRITE-buffering component also continuously monitors the "writeDQ" signal in step 1507, and when the READ/WRITE controller has processed a next WRITE operation, adjusts the circular queue by calling the routine "output" 1508.

Figure 16:
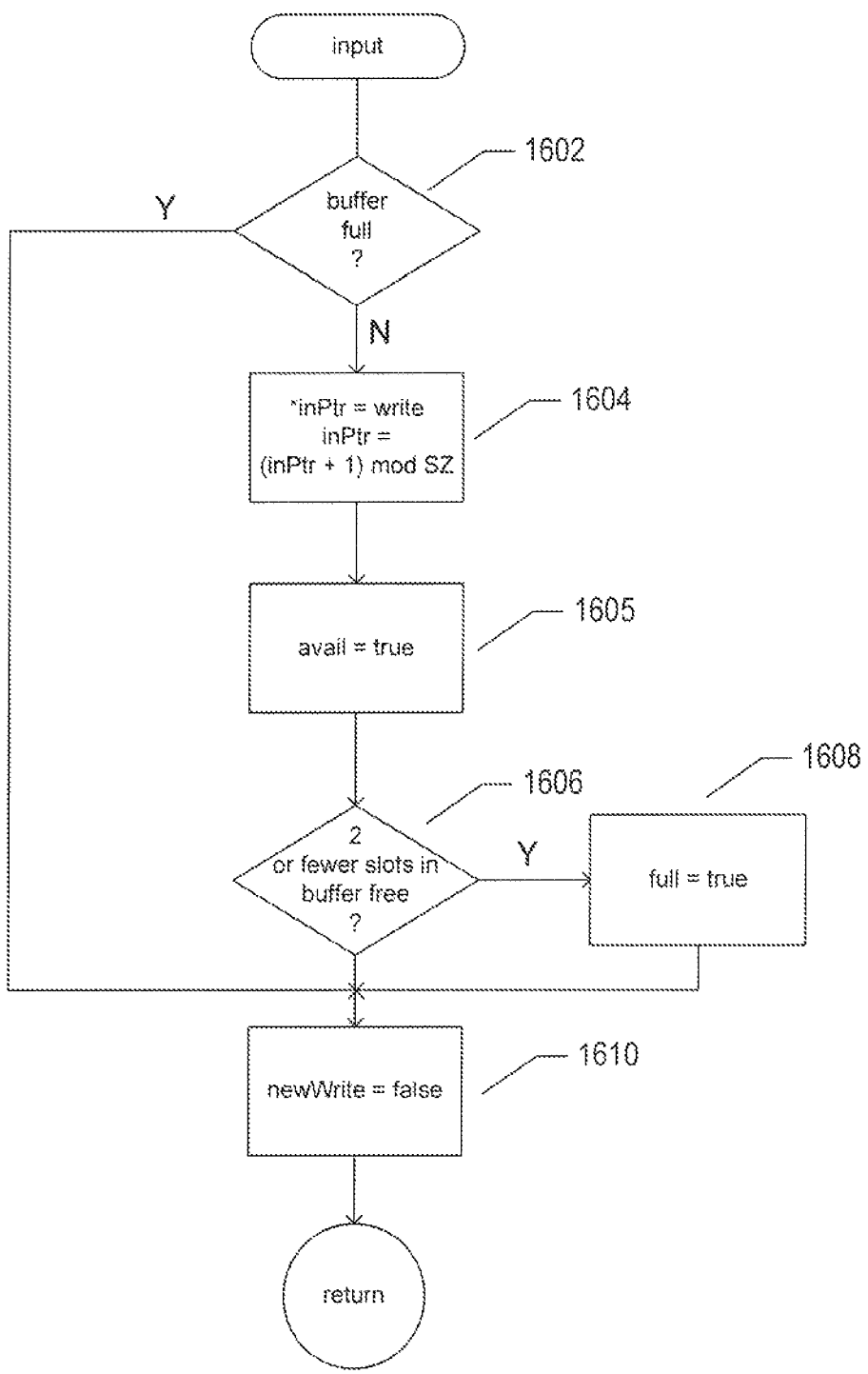
FIG. 16 provides a control-flow diagram for the routine "input" (1506 in FIG. 15).

FIG. 16 provides a control-flow diagram for the routine "input" (1506 in FIG. 15). In step 1602, the routine "Input" determines whether or not the circular queue is full. The circular queue is full when the value stored in variable "outPtr" is equal to the value stored in variable "inPtr" incremented by one, or when outPtr points to the last data-storage unit in the buffer and inPtr points to the first data-storage unit in the buffer. This should never occur. However, were this condition to occur, the information-storage device would simply drop the received WRITE operation, because there is no way to process the received WRITE operation due to the large number of previously received WRITE operations currently stored in the circular buffer. Next, in step 1604, the routine "input" stems the WRITE operation into the slot of the circular queue pointed to by the variable "inPtr" and then adjusts the variable "inPtr" to point to a subsequent buffer slot. Modular arithmetic is used in order to circularize a linear buffer. Next, in step 1605, the routine "input" sets the variable "avail" to TRUE, generating a signal to the READ/WRITE controller that indicates that a next WRITE operation is available. When there are two or fewer free slots remaining in the circular buffer, as determined in step 1606, the routine "input" sets the variable "full" to TRUE, generating a signal to the READ/WRITE controller, in step 1608, to indicate that the circular buffer be emptied as quickly as possible in order to prevent dropping of subsequently received WRITE operations. Finally, in step 1610, the variable "newWrite" is set to FALSE so that a next WRITE operation received from the external device can be subsequently detected.

Figure 17:
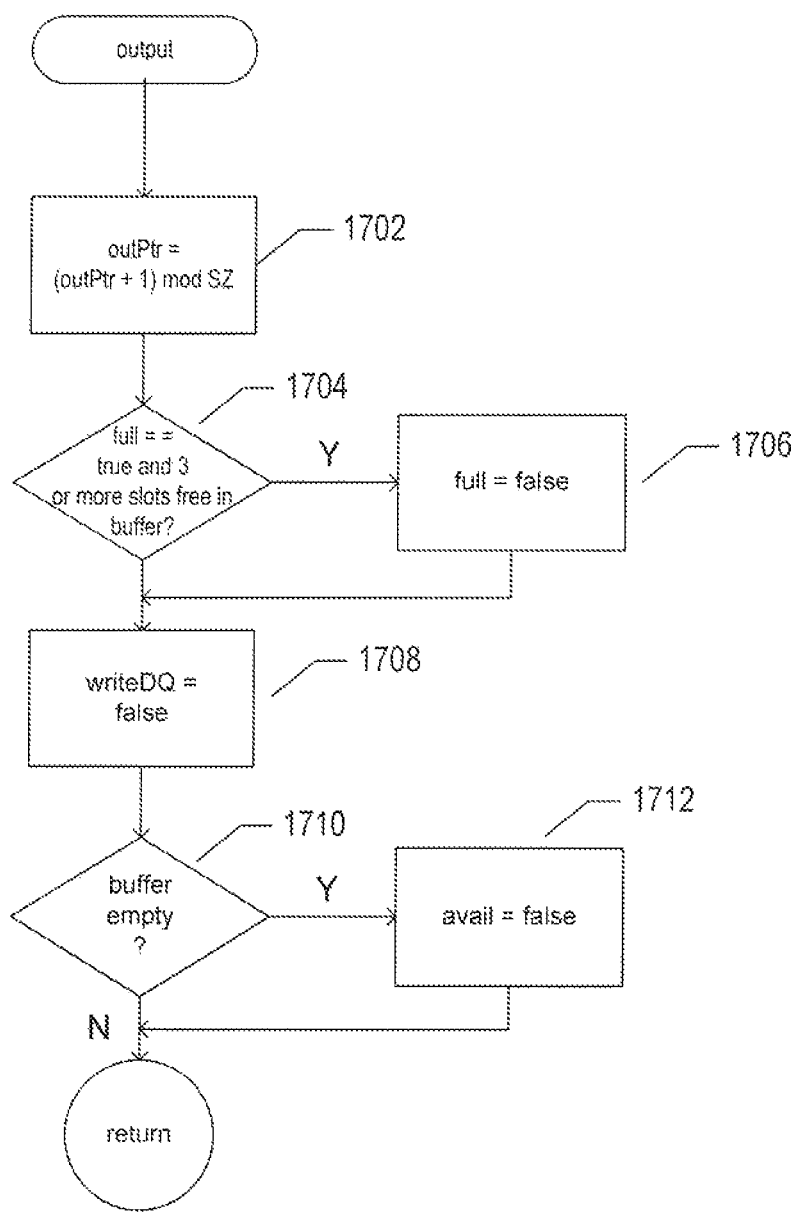
FIG. 17 provides a control-flow diagram for the routine "output" (1508 in FIG. 15).

FIG. 17 provides a control-flow diagram for the routine "output" (1508 in FIG. 15). In step 1702, the variable "outPtr" is adjusted, by modular arithmetic, to point to the circular buffer slot following the circular buffer slot from which the READ/WRITE controller received a WRITE operation. When emptying of the circular buffer slot has increased the number of free circular buffer slots to three or more, as determined in step 1704, then the variable "full" is set to FALSE, in step 1706, to discontinue signaling the READ/WRITE controller of the need to empty the circular buffer as quickly as possible. In step 1708, the variable "writeDQ" is set to FALSE to signal the READ/WRITE controller that the circular queue has been adjusted following transmission of a next WRITE operation to the READ/WRITE controller from the WRITE-buffering component. In step 1710, the write-buffering component determines whether or not the circular buffer is now empty. If so, then the variable "avail" is set to FALSE, in step 1712, to indicate to the READ/WRITE controller that there are no currently available WRITE operations.

Figure 18:
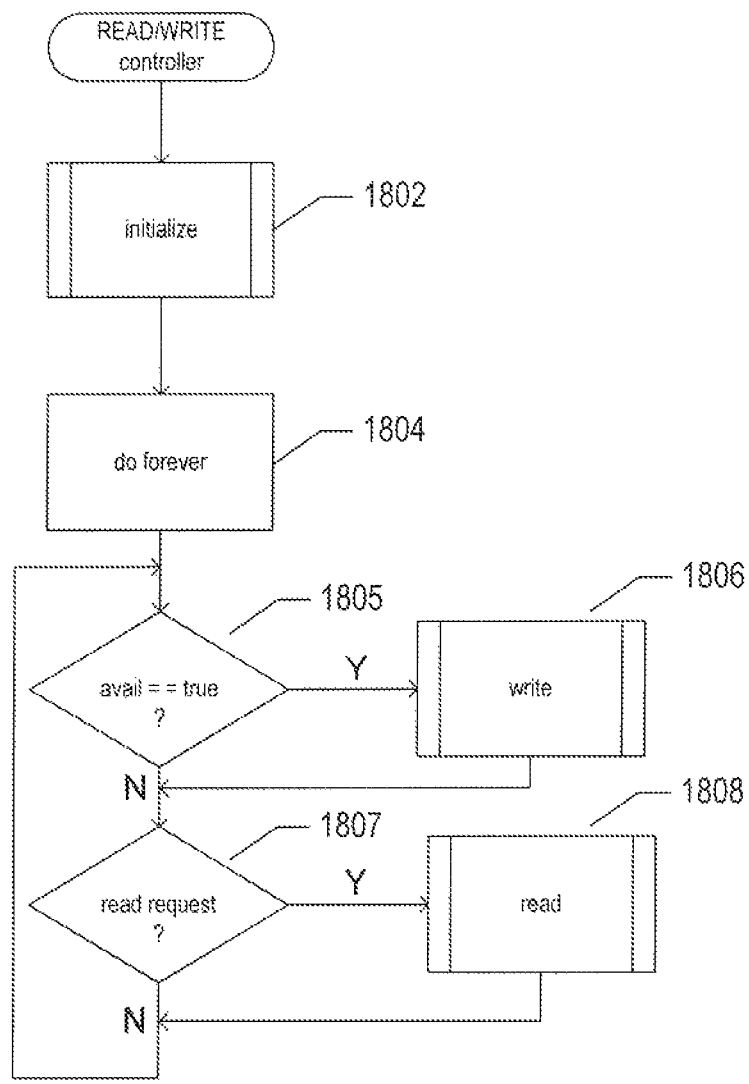
FIG. 18 provides a control-flow diagram that illustrates operation of the READ/WRITE controller (1430 in FIG. 14).

FIG. 18 provides a control-flow diagram that illustrates operation of the READ/WRITE controller (1430 in FIG. 14). In step 1802, the READ/WRITE controller is initialized upon power-up or reset. Then, in the continuous loop of steps 1804-1808, the READ/WRITE controller monitors the signal represented by the variable "avail" and READ requests from external sources, calling the routine "WRITE" 1806 when WRITE requests are available from the WRITE-buffering component and calling the routine "READ" 1808 when new READ requests have been received.

Figure 19:
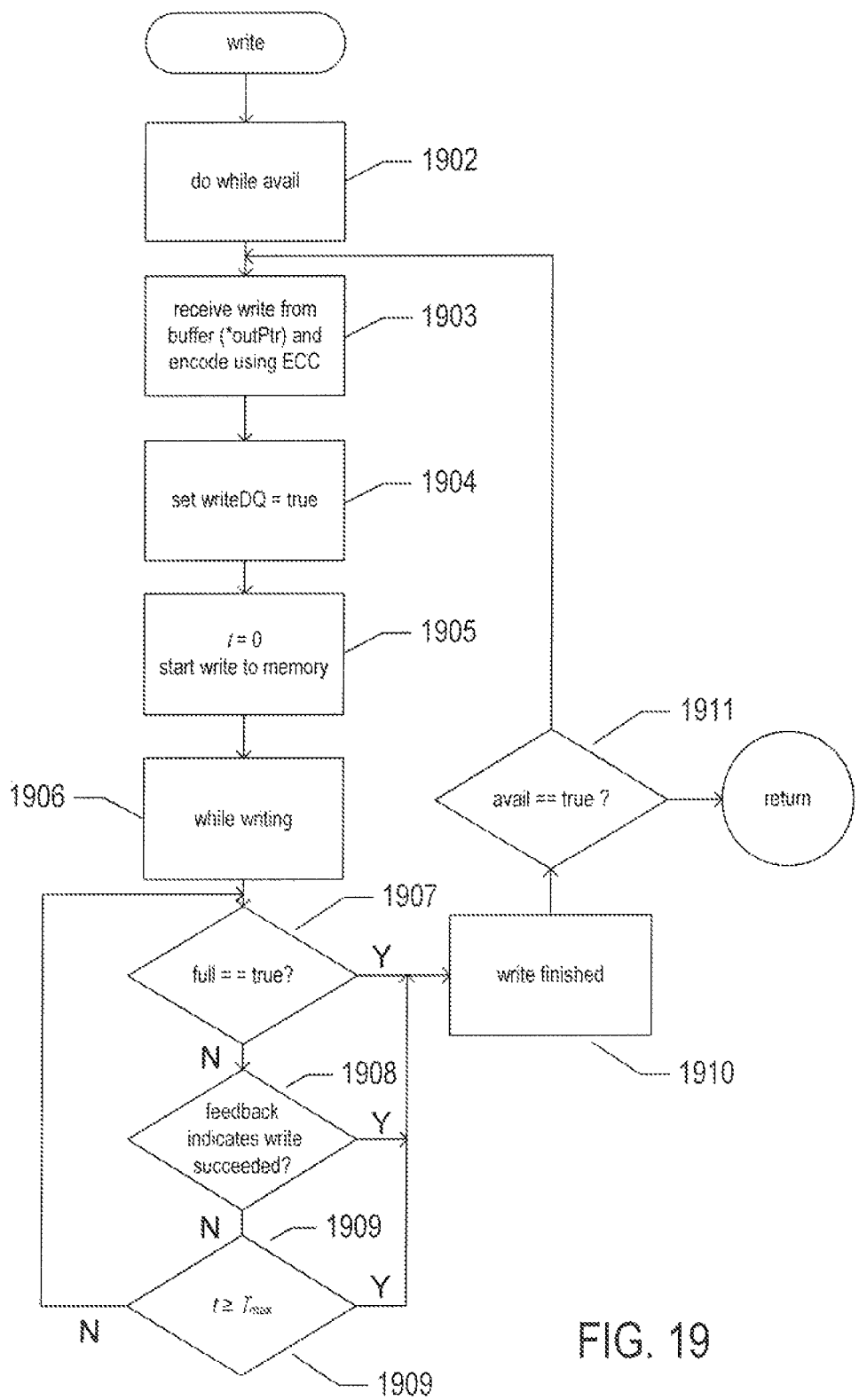
FIG. 19 provides a control-flow diagram for the routine "WRITE" (1806 in FIG. 18).

FIG. 19 provides a control-flow diagram for the routine "WRITE" (1806 in FIG. 18). The routine "WRITE" comprises an outer continuous loop of steps 1902-1911 which includes an inner loop of steps 1906-1909. While the "avail" signal indicates that there are WRITE requests to handle, the routine "WRITE" receives the next WRITE request from the circular buffer and encodes the data associated with the WRITE request, using an ECC, in step 1903. Then, in step 1904, the routine "WRITE" sets the variable "writeDQ" to TRUE, to signal the WRITE-buffering component that a next WRITE request has been received by the READ/WRITE controller, enabling the WRITE-buffering component to complete a dequeuing process for the WRITE request. In step 1905, a timer t is initialized and the READ/WRITE controller begins writing data associated with the WRITE request to memory. While the data is being written, the routine "WRITE" monitors the signal corresponding to variable "full," feedback indications from the first and second controllers (1426 and 1428 in FIG. 14), and the timer t in order to terminate the writing operation whenever termination is indicated. When the signal corresponding to variable "full" has been asserted, as determined in step 1907, the READ/WRITE controller immediately terminates the attempted WRITE in order to process and remove additional WRITE requests from the circular queue to allow incoming WRITE requests to be queued by the WRITE-buffering component. Early termination of the writing operation may result in one or more memory elements that have failed to switch. As discussed above, the READ/WRITE controller relies on ECC encoding to correct these types of data corruptions subsequently, when the data is read back from memory. When feedback indications from the first and second controllers (1426 and 1428 in FIG. 14) indicate that the write has succeeded, as determined in step 1908, then writing is terminated. Otherwise, when the timer indicates that the write has been carried out for a time equal to or greater than $T_{max}$, as determined in step 1909, the write is terminated. In step 1910, the READ/WRITE controller terminates the WRITE operation and, when there are still WRITE requests to process, as determined in step 1911, returns control to step 1903. Otherwise, the return "WRITE" returns. In FIG. 19, the data for a WRITE request is written, in parallel, to corresponding memory elements by the first and second controllers. In certain examples, WRITE requests may contain a greater amount of data than can be written in a single parallel WRITE operation, in which case additional logic, corresponding in FIG. 16 to an additional iterative loop, would be used to carry out two or more WRITE operations needed to write all of the data associated with a single WRITE request to corresponding memory elements. In certain, alternative examples, memory cells may be written, sequentially, rather in parallel.

In the above-described routines, it is assumed that the writing of data corresponding to a WRITE operation to the one or more arrays of memory elements by the routine "write" takes significantly longer than buffering of a received WRITE operation by the routine "write buffering," and thus that, when writeDQ is set to TRUE, in step 1904 by the routine "writing," the routine "write buffering" can buffer a next WRITE operation and process adjustment of buffer pointers as well as set writeDQ to FALSE, by calling the routine "output," before the routine writing can finish the current internal WRITE operation and embark on another. Were the assumption not able to be made, then additional test and steps would be used to properly synchronize operation of the two routines and/or additional synchronisation signals would be used to synchronise operation of the two routines. Of course, in general, routines are used above to illustrate operation of hardware devices that may be implemented with logic circuits, the operation of which is synchronized at lower implementation levels.

FIG. 19 provides a general description of the continuous WRITE methods in which the state of memory elements is continuously monitored. In the above-discussed alternative example, in which multi-pulse WRITE methods are employed, the inner loop of steps 1906-1909 would iterate until a WRITE-complete signal is received from the READ/WRITE controller, whether or not the WRITE succeeded, or until the full flag or signal is set.

Thus, by using ECC in addition to monitoring feedback signals from the first and second controllers, a smaller circular buffer can be used than the circular buffer used without using ECC. In other words, the buffer size can be reduced to a size that results in early termination of a certain percentage of WRITE operations, leading to a greater number of switching errors during WRITE operations than would be acceptable. However, the greater number of switching errors is subsequently reduced by the error-correcting capacity of the ECC decoder when the data is read back from memory.

Although the present disclosure has been described in terms of particular examples, it is not intended that the disclosure be limited to these examples. Modifications will be apparent to those skilled in the art. For example, the use of both feedback signals and ECC encoding can be employed in a wide variety of different types of information-storage devices that include memory elements with asymmetrical switching-time PDFs, including memristive memory elements, phase-change memory elements, and other types of memory elements. The particular ECC code employed and the particular values of $T_{max}$ employed within the information-storage devices can be set to various different codes and calculated values, respectively, in order to ensure bit-error rates for the information-storage devices that meet or exceed bit-error-rate requirements. In certain types of information-storage devices, the maximum WRITE-voltage application time $T_{max}$ and the ECC codes used for encoding the data can be controlled or reset dynamically, depending on dynamic BER requirements, the age of the information-storage device, particularly the ages of the memory elements, the total number of READ/WRITE cycles carried out on the information-storage device, and other such characteristics and parameters.

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with foe principles and novel features disclosed herein.

The invention claimed is:

1. A data-storage device comprising:
one or more arrays of memory elements that each includes
a material that switches between at least two different states by application of a switching-inducing force or gradient to the material, and
a feedback signal;
a WRITE-request buffer that buffers a received WRITE request;
an error-control-coding encoder that encodes data associated with the WRITE request; and
a READ/WRITE controller that writes the data, encoded by the error-control-coding encoder, associated with the WRITE request received from the WRITE-request buffer, to a number of memory elements by applying the switching-inducing force or gradient to the one or more arrays of memory elements until more than a maximum-allowed number of WRITE requests have been queued to the WRITE-request buffer, feedback signals indicate that the WRITE operation has completed, or the switching-inducing force or gradient has been applied for a maximum application time.

2. The data-storage device of claim 1 wherein the memory elements are characterized by log-normally-distributed switching times.

3. The data-storage device of claim 1 wherein the maximum application time is shorter than a time that would provide a specified bit error rate for uncoded WRITE operations.

4. The data-storage device of claim 3 further including an error-control-coding decoder that decodes data read from the one or more arrays of memory elements by the READ/WRITE controller.

5. The data-storage device of claim 1 wherein the size of the WRITE-request buffer is smaller than a WRITE-request-buffer size that would ensure that any WRITE operation corresponding to an already-received WRITE-request is not terminated prior to successful completion or application of the switching-inducing force or gradient for a maximum application time.

6. The data-storage device of claim 5 further including an error-control-coding decoder that decodes data read from the one or more arrays of memory elements by the READ/WRITE controller, in the process of decoding correcting a sufficient number of erroneous bit values to provide a specified bit error rate despite switching errors that occur as a result of termination of WRITE operations corresponding to already-received WRITE-requests that are terminated prior to successful completion or application of the switching-inducing force or gradient for a maximum application time.

7. The data-storage device of claim 1 wherein the data-storage medium is a memristive material that switches between a first resistivity state and a second resistivity state when a switching-inducing voltage is applied across the data-storage medium.

8. A method for writing data to a data-storage device that includes one or more arrays of memory elements, each including a material that is switched between at least two different states by application of a switching-inducing force or gradient to the material, and a feedback signal, the method comprising:
encoding data, by an error-control-coding encoder, associated with a received WRITE-request;
queuing the WRITE request to a WRITE-request buffer; and
writing the encoded data to a number of memory elements by applying the switching-inducing force or gradient to the one or more arrays of memory elements until more than a maximum-allowed number of WRITE requests have been queued to the WRITE-request buffer, feedback signals indicate that the WRITE operation has completed, or the switching-inducing force or gradient has been applied for a maximum application time.

9. The method of claim 8 further including selecting the maximum application time to be shorter than a minimum application time calculated to ensure a specified bit error rate for writing uncoded data to the one or more arrays but sufficiently long that, when the data is subsequently read from the one or more arrays and decoded by an error-control-coding decoder that corrects up to a certain number of bit errors in the data read from the one or more arrays, the overall bit error rate for writing data to, and reading the data back from, the data-storage device is less than or equal to the specified bit error rate.

10. The method of claim 8 further including selecting a size for the WRITE-request buffer to be smaller than a WRITE-request-buffer size that would ensure that any WRITE operation corresponding to an already-received WRITE-request is not terminated prior to successful completion or application of the switching-inducing force or gradient for a maximum application time, but sufficiently large that, when data is subsequently read from the one or more arrays and decoded by an error-control-coding decoder that corrects up to a certain number of bit errors in the data read from the one or more arrays, the overall bit error rate for writing data to, and reading the data back from, the data-storage device is less than or equal to the specified bit error rate.

11. The method of claim 8 wherein the data-storage medium is a memristive material that switches between a first resistivity state and a second resistivity state when a switching-inducing voltage is applied across the data-storage medium.

12. The method of claim 8 wherein the memory elements are characterized by log-normally-distributed switching times.

13. The method of claim 8 wherein the switching-inducing force or gradient is applied to the one or more arrays of memory elements continuously while the feedback signals are continuously monitored.

14. The method of claim 8 wherein the switching-inducing force or gradient is applied to the one or more arrays of memory elements during discrete intervals, between which the feedback signals are used to determine whether or not the data has been successfully written.

15. A data-storage device comprising:
one or more arrays of memory elements that each includes
a data-storage medium that is switched between at least two different states by application of a switching-inducing force or gradient to the data-storage medium;

a WRITE-request buffer;

an error-control-coding encoder that encodes received data; and a READ/WRITE controller that writes data encoded by the error-control-coding encoder to a number of memory elements by applying the switching-inducing force or gradient to the one or more arrays of memory elements in multiple pulses, verifying that the WRITE operation has succeeded after each pulse by a READ operation, until more than a maximum-allowed number of WRITE requests have been queued to the WRITE-request buffer, until the WRITE operation has completed, or until a maximum number of pulses have been applied.

* * * * *